(12) United States Patent
Sun et al.

(10) Patent No.: US 11,882,665 B2
(45) Date of Patent: Jan. 23, 2024

(54) PRINTED CIRCUIT BOARD AND MANUFACTURING METHOD THEREOF, AND ELECTRONIC DEVICE

(71) Applicant: Huawei Technologies Co., Ltd., Shenzhen (CN)

(72) Inventors: Zhengbao Sun, Shenzhen (CN); Xu Zhang, Dongguan (CN); Bin Wang, Shenzhen (CN); Hai Hao, Xi'an (CN); Lijun Peng, Xi'an (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 391 days.

(21) Appl. No.: 17/358,768

(22) Filed: Jun. 25, 2021

(65) Prior Publication Data
US 2021/0329791 A1 Oct. 21, 2021

Related U.S. Application Data

(63) Continuation of application No. PCT/CN2018/124960, filed on Dec. 28, 2018.

(51) Int. Cl.
| | |
|---|---|
| H05K 1/11 | (2006.01) |
| H05K 3/34 | (2006.01) |
| H05K 1/18 | (2006.01) |
| H05K 3/30 | (2006.01) |

(52) U.S. Cl.
CPC ........... *H05K 3/3447* (2013.01); *H05K 1/115* (2013.01); *H05K 1/184* (2013.01); *H05K 3/306* (2013.01)

(58) Field of Classification Search
CPC ..... H05K 1/116; H05K 3/3452; H05K 3/3447
See application file for complete search history.

(56) References Cited

U.S. PATENT DOCUMENTS

| | | | |
|---|---|---|---|
| 2003/0192716 A1* | 10/2003 | Yamaguchi | H05K 3/284 |
| | | | 174/265 |
| 2004/0011556 A1 | 1/2004 | Torii | |
| 2005/0082682 A1 | 4/2005 | Liu | |
| 2008/0173470 A1* | 7/2008 | Barbetta | H05K 3/282 |
| | | | 174/257 |
| 2008/0268267 A1* | 10/2008 | Barbetta | H05K 3/244 |
| | | | 428/458 |
| 2009/0211795 A1 | 8/2009 | Shirasawa | |
| 2009/0236129 A1* | 9/2009 | Schueller | H05K 3/244 |
| | | | 174/257 |
| 2018/0218922 A1 | 8/2018 | Darveaux | |

FOREIGN PATENT DOCUMENTS

| | | |
|---|---|---|
| CN | 1620844 A | 5/2005 |
| JP | H0494591 A | 3/1992 |
| WO | 2005072032 A1 | 8/2005 |

* cited by examiner

*Primary Examiner* — Sherman Ng
(74) *Attorney, Agent, or Firm* — Slater Matsil, LLP

(57) ABSTRACT

This application relates to the field of electronic technologies, and provides a printed circuit board and a manufacturing method thereof, and an electronic device. The printed circuit board has target holes that penetrate through the printed circuit board, and an area that is not provided with the target holes has blocking structures (B) for blocking liquid flow, where the area is on at least one side that is of the printed circuit board and that is connected to the target holes.

18 Claims, 16 Drawing Sheets

Manufacture a printed circuit board, where the printed circuit board has target holes that penetrate through the printed circuit board, and an area that is on at least one side, of the printed circuit board, connected to the target holes and that is not provided with the target holes has blocking structures for blocking liquid flow

1501

PRINTED CIRCUIT BOARD AND MANUFACTURING METHOD THEREOF, AND ELECTRONIC DEVICE

CROSS-REFERENCE TO RELATED APPLICATIONS

This application is a continuation of International Application No. PCT/CN2018/124960, filed on Dec. 28, 2018. The disclosures of the aforementioned applications are hereby incorporated by reference in their entireties.

TECHNICAL FIELD

This application relates to the field of electronic technologies, and in particular, to a printed circuit board and a manufacturing method thereof, and an electronic device.

BACKGROUND

A printed circuit board (PCB) is an important component of an electronic device. The printed circuit board generally includes a first solder resist layer, a base material, a conductive pattern layer, and a second solder resist layer that are stacked in sequence.

The printed circuit board has target holes that penetrate through the first solder resist layer, the base material, the conductive pattern layer, and the second solder resist layer. A pin of an external electronic device can be inserted into the target holes and electrically connected to the conductive pattern layer.

However, because the target holes penetrate through the entire printed circuit board, the conductive pattern layer is exposed to an environment through the target holes, so that the conductive pattern layer (generally made of copper) is relatively easy to be corroded. In addition, a corrosion product (for example, $Cu_2S$) formed after the conductive pattern layer is corroded spreads out of the holes. When a spreading area of the corrosion product is relatively large, the printed circuit board cannot be normally used.

SUMMARY

This application provides a printed circuit board and a manufacturing method thereof, and an electronic device. This application can reduce spreading of a corrosion product outside holes, and avoid that the printed circuit board cannot be normally used.

According to a first aspect, a printed circuit board is provided. The printed circuit board has target holes that penetrate through the printed circuit board, and an area that is not provided with the target holes has blocking structures for blocking liquid flow, where the area is on at least one side that is of the printed circuit board and that is connected to the target holes. In the printed circuit board provided in this embodiment of the present invention, the at least one side, of the printed circuit board, connected to the target holes has the blocking structures for blocking liquid flow. The blocking structures can prevent liquid from flowing, thereby reducing spreading of a corrosion product formed by corrosion in a layer of water. In this way, a spreading area of the corrosion product outside the target holes can be relatively small, thereby reducing a probability that the printed circuit board cannot be normally used.

Optionally, the printed circuit board includes a first solder resist layer, a base material, a conductive pattern layer, a second solder resist layer that are stacked in sequence. The target holes penetrate through the first solder resist layer, the base material, the conductive pattern layer, and the second solder resist layer. The blocking structures in the printed circuit board each include at least one of a groove and a protrusion, and there is a spacing between the groove and the conductive pattern layer. When the corrosion product spreads with the layer of water, if the corrosion product meets the protrusion, the corrosion product needs to climb over the protrusion to continue to spread; and if the corrosion product meets the groove, the corrosion product needs to climb over the groove to continue to spread. Therefore, the spreading of the corrosion product is suppressed. Both the protrusion and the groove can increase a spreading difficulty of the corrosion product, and delay the spreading of the corrosion product.

Optionally, an orthographic projection area of the groove on the base material is located outside an orthographic projection area of the conductive pattern layer on the base material. In other words, no groove is disposed in an area that has the conductive pattern layer in the printed circuit board, and the groove can be disposed in an area that does not have the conductive pattern layer. In this way, the groove in the printed circuit board can be prevented from penetrating through the conductive pattern layer, thereby avoiding further corrosion of the conductive pattern layer.

Optionally, when a side on which the first solder resist layer is located in the printed circuit board has the groove, the first solder resist layer has a first auxiliary hole that penetrates through the first solder resist layer, and the first auxiliary hole and a surface of the base material facing the first solder resist layer form a first groove on the side on which the first solder resist layer is located. When a side on which the second solder resist layer is located in the printed circuit board has the groove, the second solder resist layer has a second auxiliary hole that penetrates through the second solder resist layer, and the second auxiliary hole and a surface of the base material facing the second solder resist layer form a second groove on the side on which the second solder resist layer is located. In a related technology, when a solder resist layer (for example, the first solder resist layer and the second solder resist layer) is formed, holes also need to be drilled in the solder resist layer. Therefore, in this embodiment of the present invention, drilling additional holes (such as the first auxiliary hole and the second auxiliary hole) in the solder resist layer does not add much additional manufacturing processes and manufacturing costs.

Optionally, when the side on which the first solder resist layer is located in the printed circuit board has the protrusion, the printed circuit board further includes a first protrusion located on a surface that is of the first solder resist layer and that is far away from the base material. When the side on which the second solder resist layer is located in the printed circuit board has the protrusion, the printed circuit board further includes a second protrusion located on a surface that is of the second solder resist layer and that is far away from the base material.

Optionally, the printed circuit board further includes a first marking ink layer and a second marking ink layer. The first marking ink layer is located on the surface that is of the first solder resist layer and that is far away from the base material, and the second marking ink layer is located on the surface that is of the second solder resist layer and that is far away from the base material. A material of the first protrusion is the same as a material of the first marking ink layer, and a material of the second protrusion is the same as a material of the second marking ink layer. In this way, there is no need to specially provide a new material for manufacturing the protrusion in the printed circuit board. Instead, an original material used for manufacturing the marking ink layer may be used for manufacturing the protrusion. In addition, because the material of the first protrusion is the same as the material of the first marking ink layer, and both the first protrusion and the first marking ink layer are located on the side that is of the first solder resist layer and that is far away from the base material, the first marking ink layer and the first protrusion may be manufactured at the same time, in other words, the first marking ink layer and the first protrusion may be formed at the same time. Similarly, the second protrusion and the second marking ink layer may also be formed at the same time. In this way, the first protrusion and the second protrusion do not need to be manufactured by using a new process and a new device, thereby simplifying a process and reducing costs of manufacturing the printed circuit board.

Optionally, the printed circuit board has a plurality of target holes, and one of the blocking structures exists between every two of the target holes in the printed circuit board. In this way, the spreading area of the corrosion product outside each of the target holes can be relatively small, and a short circuit caused by the corrosion product between adjacent target holes can be prevented, thereby further reducing a probability that the printed circuit board cannot be normally used.

Optionally, the plurality of target holes in the printed circuit board are arranged in m rows and n columns, m≥2, n≥2, and the blocking structures each are in a strip structure. At least one blocking structure whose length direction is parallel to a row arrangement direction of the target holes exists between every two of the rows of the target holes; and at least one blocking structure whose length direction is parallel to a column arrangement direction of the target holes exists between every two of the columns of the target holes. In this case, every two adjacent target holes are isolated from each other through at least one blocking structure, thereby preventing the short circuit caused by the corrosion product between the adjacent target holes.

Optionally, the blocking structures each are in an annular structure, each of the blocking structures in the printed circuit board corresponds to one target hole, and each of the blocking structures surrounds the corresponding target hole. The annular-structured blocking structures can prevent the corrosion product from being spread to various directions of the target holes.

Optionally, each of the target holes in the printed circuit board corresponds to the plurality of blocking structures that are mutually embedded. In this way, the plurality of blocking structures can block the spreading of the corrosion product formed at the target holes A, thereby further improving an effect of blocking the spreading of the corrosion product.

Optionally, the plurality of target holes in the printed circuit board are arranged in m rows and n columns, m≥2, n≥2, and the blocking structures each are in a multilateral annular structure and include a plurality of lateral structures. A plurality of blocking structures that share the lateral structures exist in at least one of the row arrangement direction and the column arrangement direction of the target holes. Structures of the blocking structures in the printed circuit board can be simplified by sharing the lateral structures between the blocking structures, thereby simplifying the process and reducing the costs of manufacturing the blocking structures.

Optionally, the blocking structures each are in an annular structure with at least one notch. The structures of the blocking structures can also be simplified by designing the blocking structures as the annular structures with the notches, thereby simplifying the process and reducing the costs of manufacturing the blocking structures.

Optionally, a center line of each of the target holes is perpendicular to the printed circuit board; in a reference plane parallel to the printed circuit board, a connection line corresponding to any two adjacent target holes are located outside an orthographic projection area of a notch on the reference plane; and two end points of the connection line are two points of orthographic projections of center lines of the any two adjacent target holes on the reference plane. In this way, opening positions of the notches can be relatively far away from the two target holes, so that the corrosion product can be prevented from flowing through the notches.

Optionally, a depth range of the groove is from 10 micrometers to 16 micrometers, and a height range of the protrusion is from 10 micrometers to 16 micrometers. Generally, a thickness of the layer of water is approximately from 0.01 micrometer to 1 micrometer. In this case, a thickness of the corrosion product generated on the printed circuit board is generally from 1 micrometer to 2 micrometers. Therefore, if the depth range of the groove is set to from 10 micrometers to 16 micrometers, and the height range of the protrusion is set from 10 micrometers to 16 micrometers, the corrosion product is effectively prevented from spreading.

Optionally, the target holes in the printed circuit board each include at least one of a press-fit hole, a test hole, and a via.

According to another aspect, a printed circuit board manufacturing method is provided. The method includes: manufacturing a printed circuit board, where the printed circuit board has target holes that penetrate through the printed circuit board, and an area that is not provided with the target holes has blocking structures for blocking liquid flow, where the area is on at least one side that is of the printed circuit board and that is connected to the target holes.

Optionally, the manufacturing a printed circuit board includes: forming a first solder resist layer, a base material, a conductive pattern layer, a second solder resist layer that are stacked in sequence. The target holes penetrate through the first solder resist layer, the base material, the conductive pattern layer, and the second solder resist layer. The blocking structures in the printed circuit board each include at least one of a groove and a protrusion, and there is a spacing between the groove and the conductive pattern layer.

Optionally, an orthographic projection area of the groove on the base material in the printed circuit board is located outside an orthographic projection area of the conductive pattern layer on the base material.

Optionally, when a side on which the first solder resist layer is located in the printed circuit board has the groove, the first solder resist layer has a first auxiliary hole that penetrates through the first solder resist layer, and the first auxiliary hole and a surface of the base material facing the first solder resist layer form a first groove on the side on which the first solder resist layer is located. When a side on which the second solder resist layer is located in the printed circuit board has the groove, the second solder resist layer has a second auxiliary hole that penetrates through the second solder resist layer, and the second auxiliary hole and a surface of the base material facing the second solder resist layer form a second groove on the side on which the second solder resist layer is located.

Optionally, when the side on which the first solder resist layer is located in the printed circuit board has the protrusion, the manufacturing a printed circuit board further includes: forming a first protrusion located on a surface that is of the first solder resist layer and that is far away from the base material. When the side on which the second solder resist layer is located in the printed circuit board has the protrusion, the manufacturing a printed circuit board further includes: forming a second protrusion located on a surface that is of the second solder resist layer and that is far away from the base material.

Optionally, the manufacturing a printed circuit board further includes: forming a first marking ink layer on the surface that is of the first solder resist layer and that is far away from the base material, where a material of the first protrusion is the same as a material of the first marking ink layer; and forming a second marking ink layer on the surface that is of the second solder resist layer and that is far away from the base material, where a material of the second protrusion is the same as a material of the second marking ink layer.

According to still another aspect, an electronic device is provided, where the electronic device includes the foregoing printed circuit board.

DETAILED DESCRIPTION OF ILLUSTRATIVE EMBODIMENTS

To make objectives, technical solutions, and advantages of this application clearer, the following further describes implementations of this application in detail with reference to the accompanying drawings.

Figure 1A:
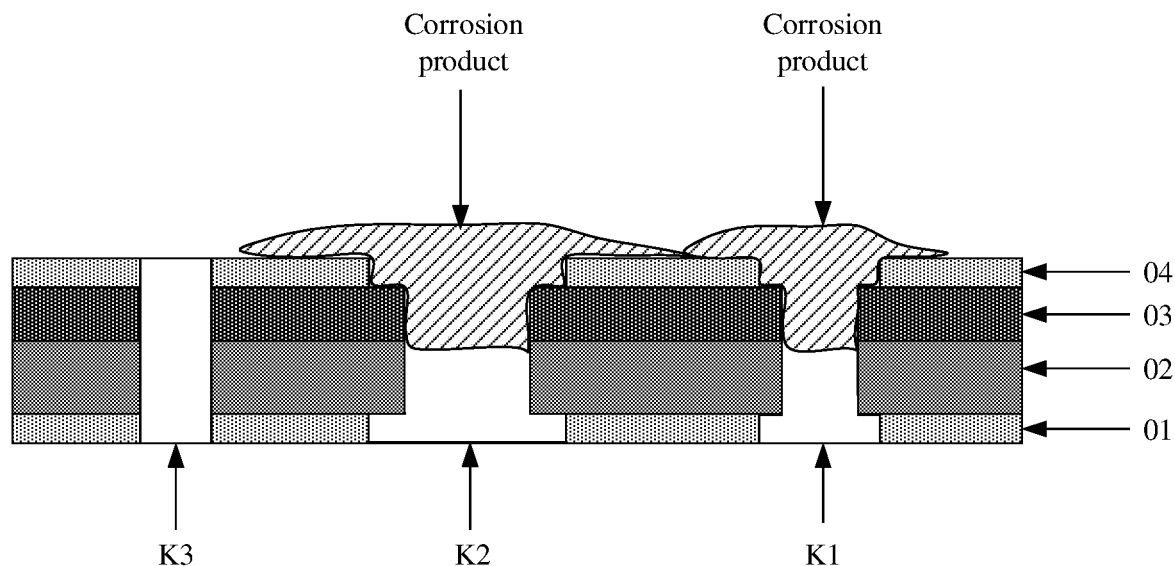
FIG. 1A is a schematic structural diagram of a printed circuit board according to a related technology.

FIG. 1A shows a printed circuit board in a related technology. As shown in FIG. 1A, the printed circuit board includes a first solder resist layer 13, a base material 02, a conductive pattern layer 03, and a second solder resist layer 14 that are stacked in sequence. Generally, the printed circuit board includes at least one of a press-fit hole, a test hole, and a via. FIG. 1A shows the three holes at the same time, and all the three holes penetrate through the entire printed circuit board.

For example, a press-fit hole K1 generally includes a through hole that penetrates through the first solder resist layer 13, a through hole that penetrates through the base material 02, a through hole that penetrates through the conductive pattern layer 03, and a through hole that penetrates through the second solder resist layer 14. In addition, a cross-sectional area of the through hole that penetrates through the base material 02 is the same as a cross-sectional area of the through hole that penetrates through the conductive pattern layer 03. A cross-sectional area of the through hole that penetrates through the first solder resist layer 13 is the same as a cross-sectional area of the through hole that penetrates through the second solder resist layer 14. Both the cross-sectional area of the through hole that penetrates through the first solder resist layer 13 and the cross-sectional area of the through hole that penetrates through the second solder resist layer 14 are greater than the cross-sectional area of the through hole that penetrates through the conductive pattern layer 03. The press-fit hole K1 may be in interference fit with a pin of an external electronic device (not shown in FIG. 1A), to implement connection with the electronic device.

For another example, a structure of a test hole K2 is generally similar to a structure of the press-fit hole K1, but a cross-sectional area of a through-hole that penetrates through each of the layers of the structure (for example, the first solder resist layer 13, the base material 02, the conductive pattern layer 03, or the second solder resist layer 14) of the test hole K2 is greater than a cross-sectional area of a through-hole that penetrates through the same layer of the structure of the press-fit hole K1. A test instrument may be connected to the conductive pattern layer 03 through the test hole K2, to detect an electrical characteristic of the conductive pattern layer 03.

For still another example, a structure of a via K3 is usually similar to the structure of the press-fit hole K1, but cross-sectional areas of through holes that penetrate through the first solder resist layer 13, the base material 02, the conductive pattern layer 03, and the second solder resist layer 14 in the via K3 are the same. It should be noted that the conductive pattern layer 03 generally includes a plurality of conductive layers and an insulation layer located between every two of the conductive layers, and at least two of the conductive layers in the plurality of conductive layers can be connected to the conductive pattern layer 03 through the via K3.

It should be noted that, in this embodiment of the present invention, an example in which all the press-fit hole K1, the test hole K2, and the via K3 are through holes that penetrate through the entire printed circuit board is used. Optionally, at least one of the press-fit hole K1, the test hole K2, and the via K3 may also be a blind via hole that does not penetrate through the entire printed circuit board.

The printed circuit board shown in FIG. 1A is relatively easy to be corroded. For example, there are a large quantity of water molecules in the air. When these water molecules are deposited on a surface of the printed circuit board, a layer of water is formed on the surface of the printed circuit board. In addition, there are a large quantity of pollution gases (such as chlorine gas, nitrogen monoxide, hydrogen sulfide, and sulfur dioxide) in the air. These pollution gases can be dissolved in the layer of water and produce chemical reactions with the conductive pattern layer 03 (generally made of copper), to from a corrosion product, for example, $Cu_2S$ on a hole wall and the surface of the printed circuit board (FIG. 1A shows only the corrosion product at the press-fit hole K1 and the test hole K2).

The corrosion product formed after the conductive pattern layer is corroded spreads out of the holes in the layer of water (a state shown in FIG. 1A). When a spreading area of the corrosion product outside the holes is relatively large, a short circuit may be caused between the plurality of holes, and consequently the printed circuit board cannot be normally used. When an electronic device in which the printed circuit board is located is a relatively important device in a system in which the electronic device is located, if the printed circuit board cannot be used normally, the electronic device needs to be powered off, to replace the printed circuit board. The process is not only complex in operation, but also greatly affects normal operation of the system in which the electronic device is located.

Figure 1B:
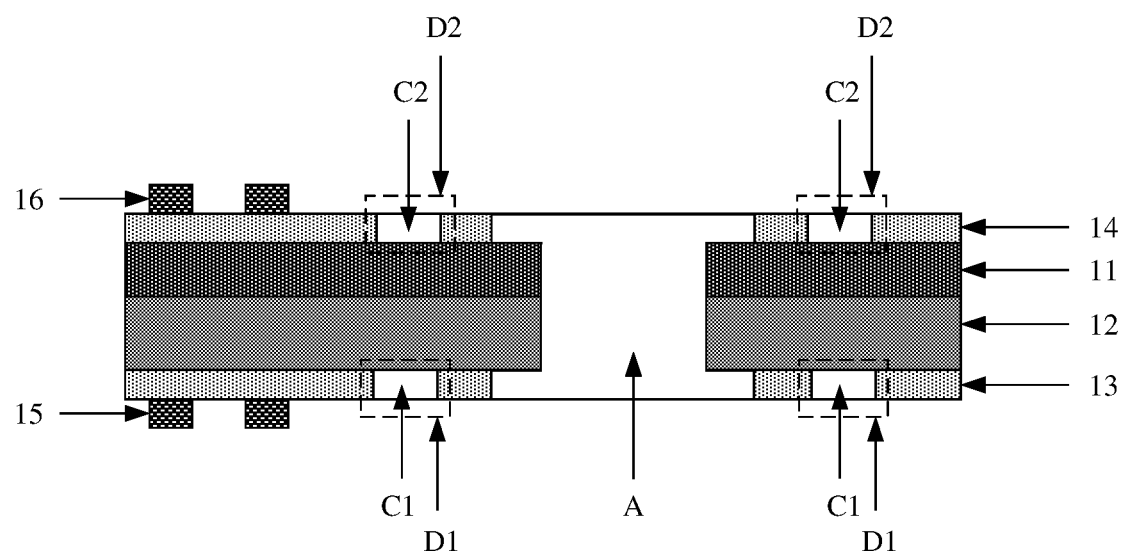
FIG. 1B is a schematic structural diagram of a printed circuit board according to an embodiment of the present invention.

This embodiment of the present invention provides a printed circuit board, where the printed circuit board can reduce spreading of a corrosion product outside the holes. For example, FIG. 1B is a schematic structural diagram of a printed circuit board according to an embodiment of the present invention. As shown in FIG. 1B, the printed circuit board has target holes A that penetrate through the printed circuit board, and an area that is not provided with the target holes A has blocking structures (for example, a first groove D1 and a second groove D2 in FIG. 1B) for blocking liquid flow where the area is on at least one side that is of the printed circuit board and that is connected to the target holes A. In FIG. 1B, an example in which the target holes A are through holes and both a side on which a first solder resist layer 13 is located and a side on which a second solder resist layer 14 is located in the printed circuit board have blocking structures is used.

In conclusion, in the printed circuit board provided in this embodiment of the present invention, at least one side of the printed circuit board has the blocking structures for blocking liquid flow. The blocking structures can prevent liquid from flowing, thereby reducing spreading of a corrosion product formed by corrosion in a layer of water. In this way, a spreading area of the corrosion product outside the target holes can be relatively small, thereby reducing a probability that the printed circuit board cannot be normally used.

Optionally, the target holes A each may be a press-fit hole, a test hole, or a via (FIG. 1B uses only an example in which the target holes are the press-fit holes). The target holes in the printed circuit board each may include at least one of the press-fit hole, the test hole, and the via. In addition, any of the target holes A may be a through hole, or may be a blind via hole. This is not limited in this embodiment of the present invention. It should be noted that, when the target holes are the through holes, at least one side connected to the target holes in the printed circuit board may be a side on which any opening position of the printed circuit board is located, or two sides on which two opening positions of blind via holes are located. When the target holes are the blind via holes, at least one side connected to the target holes in the printed circuit board is a side on which an opening position of the blind via hole in the printed circuit board is located.

Optionally, the blocking structures in this embodiment of the present invention may be any structure that can block liquid flow. For example, the blocking structures in the printed circuit board each include at least one of a groove and a protrusion, and there is a spacing between the groove and a conductive pattern layer 11. When the corrosion product spreads with the layer of water, if the corrosion product meets the protrusion, the corrosion product needs to climb over the protrusion to continue to spread; and if the corrosion product meets the groove, the corrosion product needs to climb over the groove to continue to spread. Therefore, the spreading of the corrosion product is suppressed. Both the protrusion and the groove can increase a spreading difficulty of the corrosion product, and delay the spreading of the corrosion product. For example, an orthographic projection area of the groove on a base material in the printed circuit board may be located outside an orthographic projection area of the conductive pattern layer on the base material. Optionally, the orthographic projection area of the groove on the base material in the printed circuit board may also overlap the orthographic projection area of the conductive pattern layer on the base material. This is not limited in this embodiment of the present invention.

Based on different implementations of the blocking structures, the printed circuit board also has a plurality of implementations. The following describes several possible implementations of the printed circuit board.

In a first implementation of the printed circuit board, the blocking structures include only the grooves, and a structure of the printed circuit board may be shown in FIG. 1B. In FIG. 1B, an example in which both the side on which the first solder resist layer 13 is located and the side on which the second solder resist layer 14 is located in the printed circuit board have the grooves is also used. Optionally, the side on which the first solder resist layer 13 is located has the grooves or the side on which the second solder resist layer 14 is located has the grooves. This is not limited in this embodiment of the present invention.

Optionally, as shown in FIG. 1B, the orthographic projection area of the grooves on the base material 12 in the printed circuit board may be located outside the orthographic projection area of the conductive pattern layer 11 on the base material 12. In other words, no groove is disposed in an area that has the conductive pattern layer 11 in the printed circuit board, and the grooves can be disposed in an area that does not have the conductive pattern layer 11. In this way, the grooves in the printed circuit board can be prevented from penetrating through the conductive pattern layer 11, thereby avoiding further corrosion of the conductive pattern layer 11.

Further, still referring to FIG. 1B, the printed circuit board may include the first solder resist layer 13, the base material 12, the conductive pattern layer 11, and the second solder resist layer 14 that are stacked in sequence. It should be noted that both the first solder resist layer 13 and the second solder resist layer 14 may cover the entire base material 12, to protect any position on the base material 12. The conductive pattern layer 11 may include at least one conductive layer, and when the conductive pattern layer 11 includes a plurality of conductive layers, the conductive pattern layer 11 further includes an insulation layer located between every two of the conductive layers. Optionally, the first solder resist layer 13 and the second solder resist layer 14 may not cover the entire base material 12, but cover an area in which the conductive pattern layer 11 in the base material 12 is located. This is not limited in this embodiment of the present invention. Optionally, the printed circuit board further includes a first marking ink layer 15 and a second marking ink layer 16. The first marking ink layer 15 is located on a side that is of the first solder resist layer 13 and that is far away from the base material 12, and the second marking ink layer 16 is located on a side that is of the second solder resist layer 14 and that is far away from the base material 12.

When the side on which the first solder resist layer 13 is located in the printed circuit board has the groove, the first solder resist layer 13 has a first auxiliary hole C1 that penetrates through the first solder resist layer 13, and the first auxiliary hole C1 and a surface of the base material 12 facing the first solder resist layer 13 form a first groove D1 on the side on which the first solder resist layer 13 is located. In this case, the groove on the side on which the first solder resist layer 13 is located in the printed circuit board may include the first groove D1. When the side on which the second solder resist layer 14 is located in the printed circuit board has the groove, the second solder resist layer 14 has a second auxiliary hole C2 that penetrates through the second solder resist layer 14, and the second auxiliary hole C2 and a surface of the base material 12 facing the second solder resist layer 14 form a second groove D2 on the side on which the second solder resist layer 14 is located. In this case, the groove on the side on which the second solder resist layer 14 is located in the printed circuit board may include the second groove D2.

It should be noted that, in this embodiment of the present invention, an example in which a depth of the groove is the same as a thickness of the solder resist layer (for example, a depth of the first groove is the same as a thickness of the first solder resist layer, and a depth of the second groove is the same as a thickness of the second solder resist layer) is used. In actual application, the depth of the groove may also be any depth. This is not limited in this embodiment of the present invention. In addition, when the depth of the groove is less than the depth of the solder resist layer, the first groove may be implemented by forming a groove in the first solder resist layer, and the second groove may also be implemented by forming a groove in the second solder resist layer. In a related technology, when a solder resist layer (for example, the first solder resist layer and the second solder resist layer) is formed, holes also need to be drilled in the solder resist layer. Therefore, in this embodiment of the present invention, drilling additional holes (for example, the first auxiliary hole and the second auxiliary hole) in the solder resist layer or digging additional grooves in the solder resist does not add much additional manufacturing processes and manufacturing costs.

Figure 2:
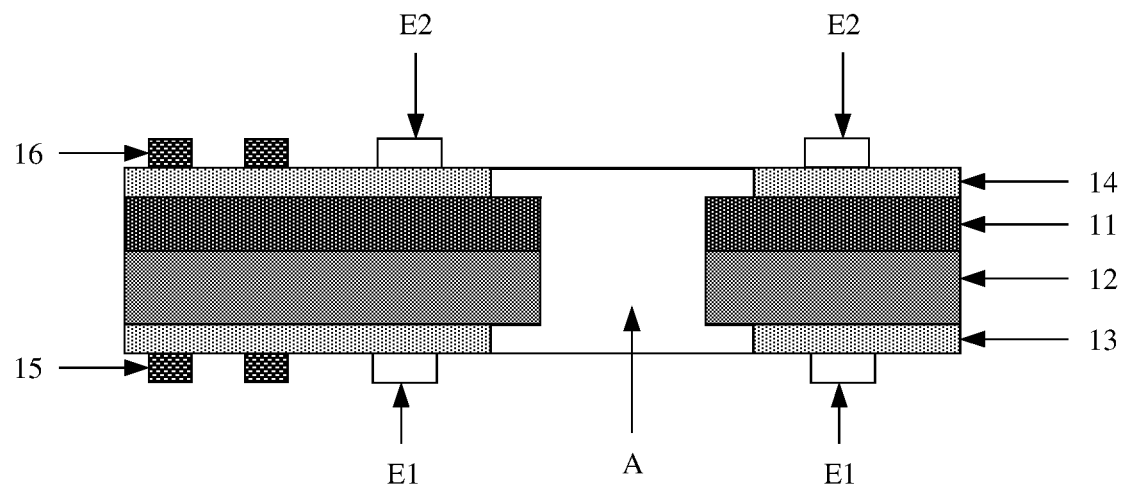
FIG. 2 is another schematic structural diagram of a printed circuit board according to an embodiment of the present invention.

In a second implementation of the printed circuit board, the blocking structures include only the protrusions, and a structure of the printed circuit board may be shown in FIG. 2. In FIG. 2, an example in which both the side on which the first solder resist layer 13 is located and the side on which the second solder resist layer 14 is located in the printed circuit board have protrusions is also used. Optionally, the side on which the first solder resist layer 13 is located has the protrusions or the side on which the second solder resist layer 14 is located has the protrusions. This is not limited in this embodiment of the present invention.

For example, as shown in FIG. 2, the printed circuit board may include the first solder resist layer 13, the base material 12, the conductive pattern layer 11, and the second solder resist layer 14 that are stacked in sequence. Optionally, the printed circuit board further includes the first marking ink layer 15 and the second marking ink layer 16. The first marking ink layer 15 is located on the surface that is of the first solder resist layer 13 and that is far away from the base material 12, and the second marking ink layer 16 is located on the surface that is of the second solder resist layer 14 and that is far away from the base material 12.

When the side on which the first solder resist layer 13 is located in the printed circuit board has the protrusions, the printed circuit board further includes a first protrusion E1 located on the surface that is of the first solder resist layer 13 and that is far away from the base material 12. In this case, the protrusions on the side on which the first solder resist layer 13 is located in the printed circuit board may include the first protrusion E1. When the side on which the second solder resist layer 14 is located in the printed circuit board has the protrusions, the printed circuit board further includes a second protrusion E2 located on the surface that is of the second solder resist layer 14 and that is far away from the base material 12. In this case, the protrusions on the side on which the second solder resist layer 14 is located in the printed circuit board may include the second protrusion E2.

Optionally, a material of the first protrusion E1 is the same as a material of the first marking ink layer 15, and a material of the second protrusion E2 is the same as a material of the second marking ink layer 16. In this way, there is no need to specially provide a new material for manufacturing the protrusion in the printed circuit board. Instead, an original material used for manufacturing the marking ink layer may be used for manufacturing the protrusion. Optionally, in this embodiment of the present invention, an example in which the material of the protrusion is the same as the material of the marking ink layer is used. In actual application, the material of the protrusion may also be different from the material of the marking ink layer. This is not limited in this embodiment of the present invention.

Optionally, the first protrusion E1, all materials of the first marking ink layer 15, the second protrusion E2, and the second marking ink layer 16 may be the same, for example, marking ink (marking ink). This is not limited in this embodiment of the present invention. It should be noted that the marking ink layer (for example, the first marking ink layer and the second marking ink layer) in the printed circuit board is a pattern used to mark a position of an electronic device (for example, a resistor, or a capacitor) in the printed circuit board or a position of the printed circuit board. The material of the marking ink layer is generally marking ink (for example, white marking ink, black marking ink, or colorful marking ink). Optionally, materials of the first solder resist layer and the second solder resist layer may be solder resist (Solder Resist).

Optionally, because the material of the first protrusion E1 is the same as the material of the first marking ink layer 15, and both the first protrusion E1 and the first marking ink layer 15 are located on the side that is of the first solder resist layer 13 and that is far away from the base material 12, the first protrusion E1 and the first marking ink layer 15 may be manufactured at the same time, in other words, the first marking ink layer 15 and the first protrusion E1 may be formed at the same time. Similarly, the second protrusion E2 and the second marking ink layer 16 may be formed at the same time. In this way, the first protrusion E1 and the second protrusion E2 do not need to be manufactured by using a new process and a new device, thereby simplifying a process and reducing costs of manufacturing the printed circuit board.

Figure 3:
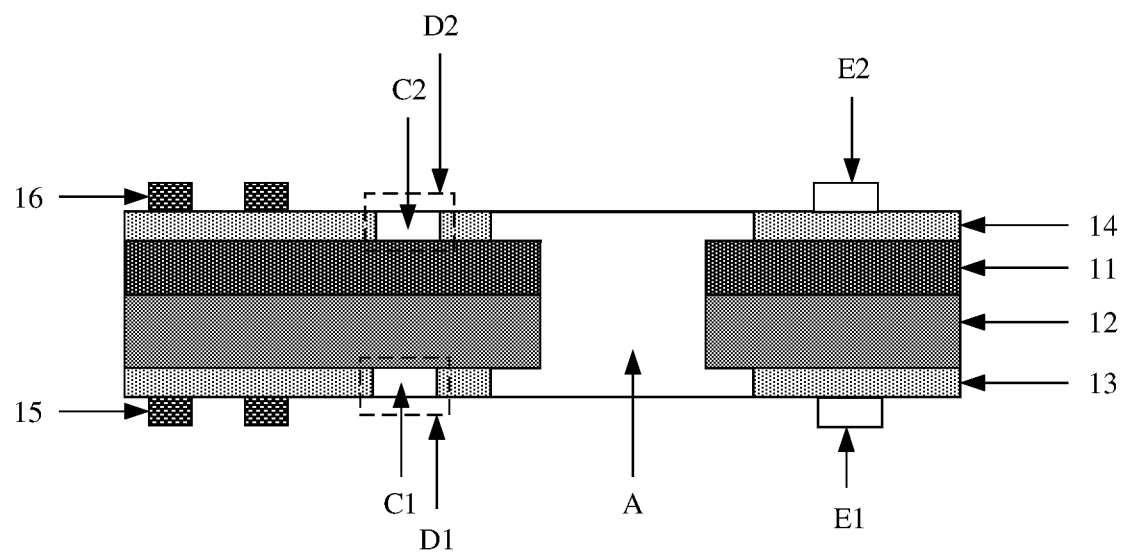
FIG. 3 is another schematic structural diagram of a printed circuit board according to an embodiment of the present invention.

In a third implementation of the printed circuit board, the blocking structures not only include the protrusions, but also include the grooves. A structure of the printed circuit board may be shown in FIG. 3. In FIG. 3, an example in which the side on which the first solder resist layer 13 is located has the protrusions and the grooves, and the side on which the second solder resist layer 14 is located also has the protrusions and the grooves is used.

Optionally, the side on which the first solder resist layer 13 is located has the grooves, and the side on which the second solder resist layer 14 is located has the protrusions. Alternatively, the side on which the first solder resist layer 13 is located has the protrusions, and the side on which the second solder resist layer 14 is located has the grooves. Alternatively, the side on which the first solder resist layer 13 is located has the grooves and the protrusions, and the side on which the second solder resist layer 14 is located has the protrusions. Alternatively, the side on which the first solder resist layer 13 is located has the grooves and the protrusions, and the side on which the second solder resist layer 14 is located has the grooves. Alternatively, the side on which the first solder resist layer 13 is located has the protrusions, and the side on which the second solder resist layer is located has the protrusion and the grooves. Alternatively, the side on which the first solder resist layer 13 is located has the grooves, and the side on which the second solder resist layer is located has the protrusions and the grooves. This is not limited in this embodiment of the present invention.

Optionally, a thickness of the layer of water, generally, is approximately from 0.01 micrometer to 1 micrometer, and in this case, the thickness of the corrosion product generated on the printed circuit board is generally from 1 micrometer to 2 micrometers. Therefore, in this embodiment of the present invention, a depth range of the groove used to block liquid (water containing the corrosion product) may be greater than or equal to 10 micrometers (or from 10 micrometers to 16 micrometers, or greater than or equal to 8 micrometers, or greater than or equal to 5 micrometers). A height range of the protrusion used to block the liquid may be greater than or equal to 10 micrometers (or 10 micrometers to 16 micrometers, or greater than or equal to 8 micrometers, or greater than or equal to 5 micrometers). Both a depth direction of the groove and a height direction of the protrusion are perpendicular to the base material.

Further, the printed circuit board provided in this embodiment of the present invention may have a plurality of target holes A, and one of the blocking structures (which may be the foregoing groove or the foregoing protrusion) exists between every of the two target holes A in the printed circuit board. In this way, a spreading area of a corrosion product outside each of the target holes can be relatively small, and a short circuit between adjacent target holes can be prevented, thereby further reducing a probability that the printed circuit board cannot be normally used.

Optionally, the blocking structures in the printed circuit board in the embodiment of the present invention have a plurality of forms, and several forms are used as examples for illustration in the following.

Figure 4:
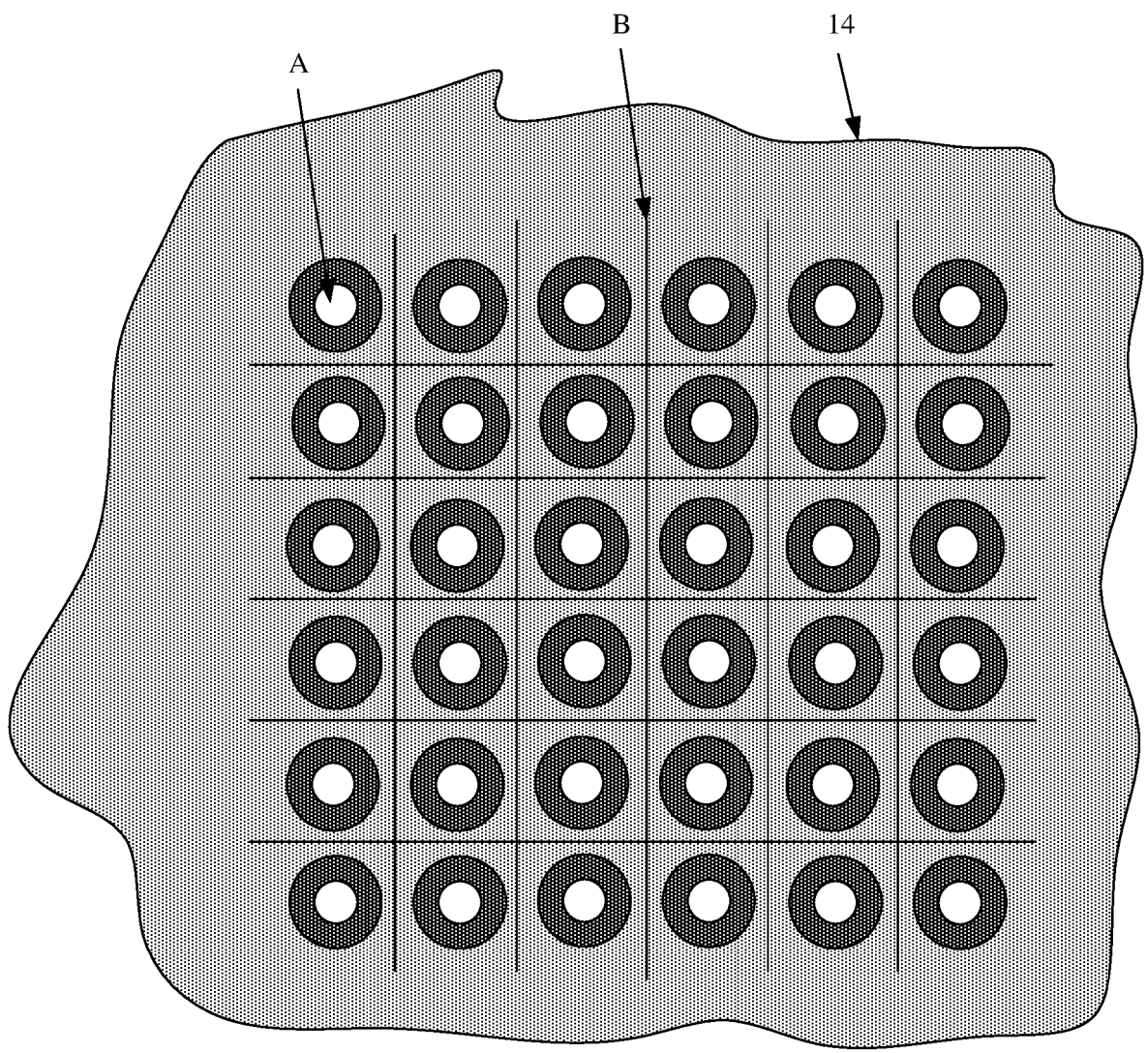
FIG. 4 is another schematic structural diagram of a printed circuit board according to an embodiment of the present invention.
Figure 5:
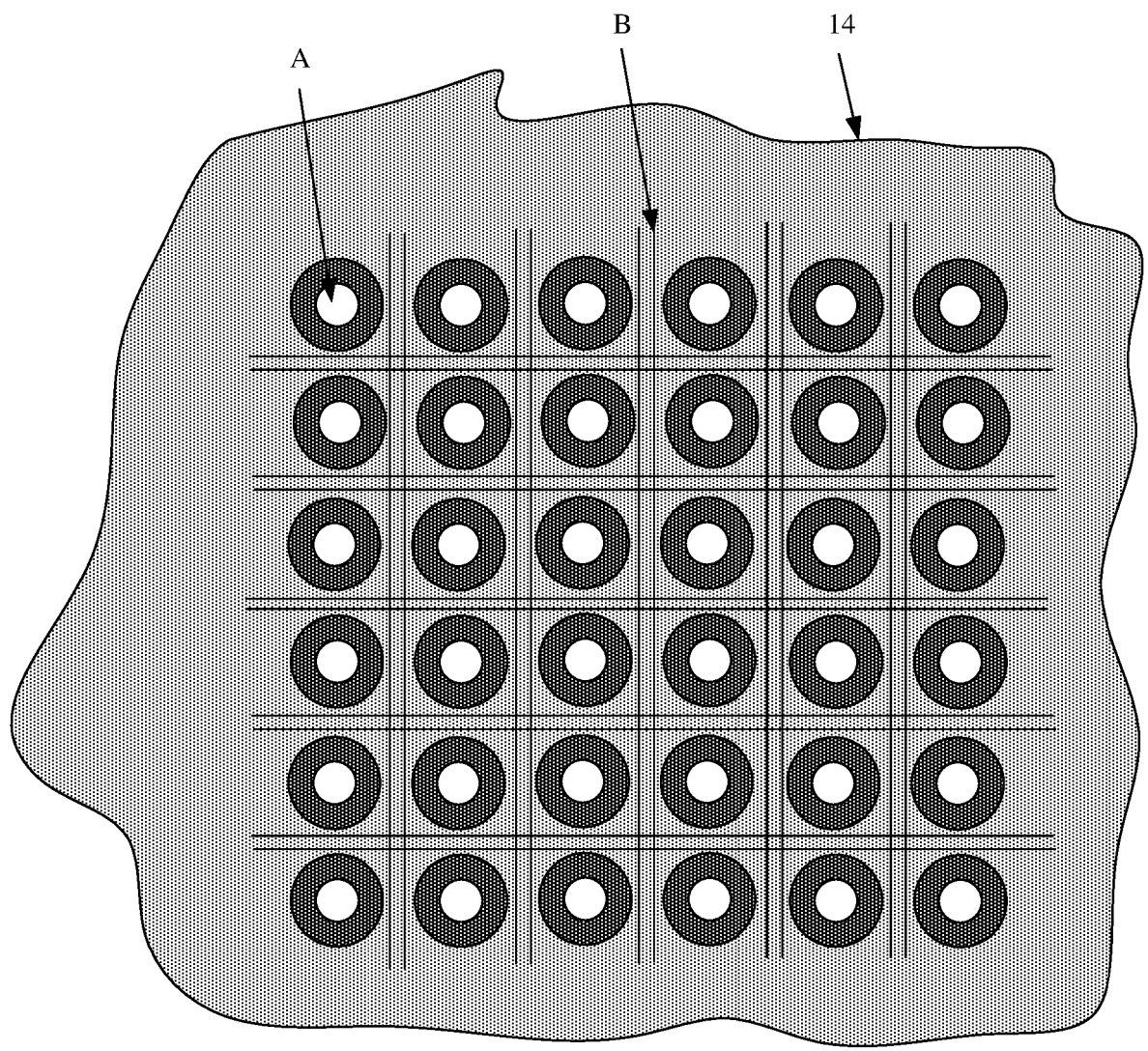
FIG. 5 is another schematic structural diagram of a printed circuit board according to an embodiment of the present invention.

According to a first aspect, the blocking structures each are in a strip structure. The plurality of target holes A in the printed circuit board are arranged in m rows and n columns, where m≥2 and n≥2. In FIG. 4, an example in which m=n=6 is used. Optionally, m may also be another value (for example, 4 or 5), and n may also be another value (for example, 7 or 8). This is not limited in this embodiment of the present invention. It should be noted that FIG. 4 shows a top view of the printed circuit board, and all FIG. 1B, FIG. 2, and FIG. 3 show schematic cross-sectional views of the printed circuit board. As shown in FIG. 4, at least one blocking structure B (which may be the foregoing groove or the foregoing protrusion) whose length direction is parallel to a row arrangement direction of the target holes A exists between every two of the rows of the target holes A, and at least one blocking structure B whose length direction is parallel to a column arrangement direction of the target holes A exists between every two of the columns of the target holes A. In FIG. 4, an example in which one blocking structure B whose length direction is parallel to the row arrangement direction of the target holes A exists between every two of the rows of the target holes A, and one blocking structure B whose length direction is parallel to the column arrangement direction of the target holes A exists between every two of the columns of the target holes A is used. Optionally, a plurality of blocking structures B (two shown in FIG. 5) whose length directions are parallel to the row arrangement direction of the target holes A exist between every two of the rows of the target holes A, and a plurality of blocking structures B (two shown in FIG. 5) whose length directions are parallel to the column arrangement direction of the target holes A exist between every two of the columns of the target holes A.

Figure 6:
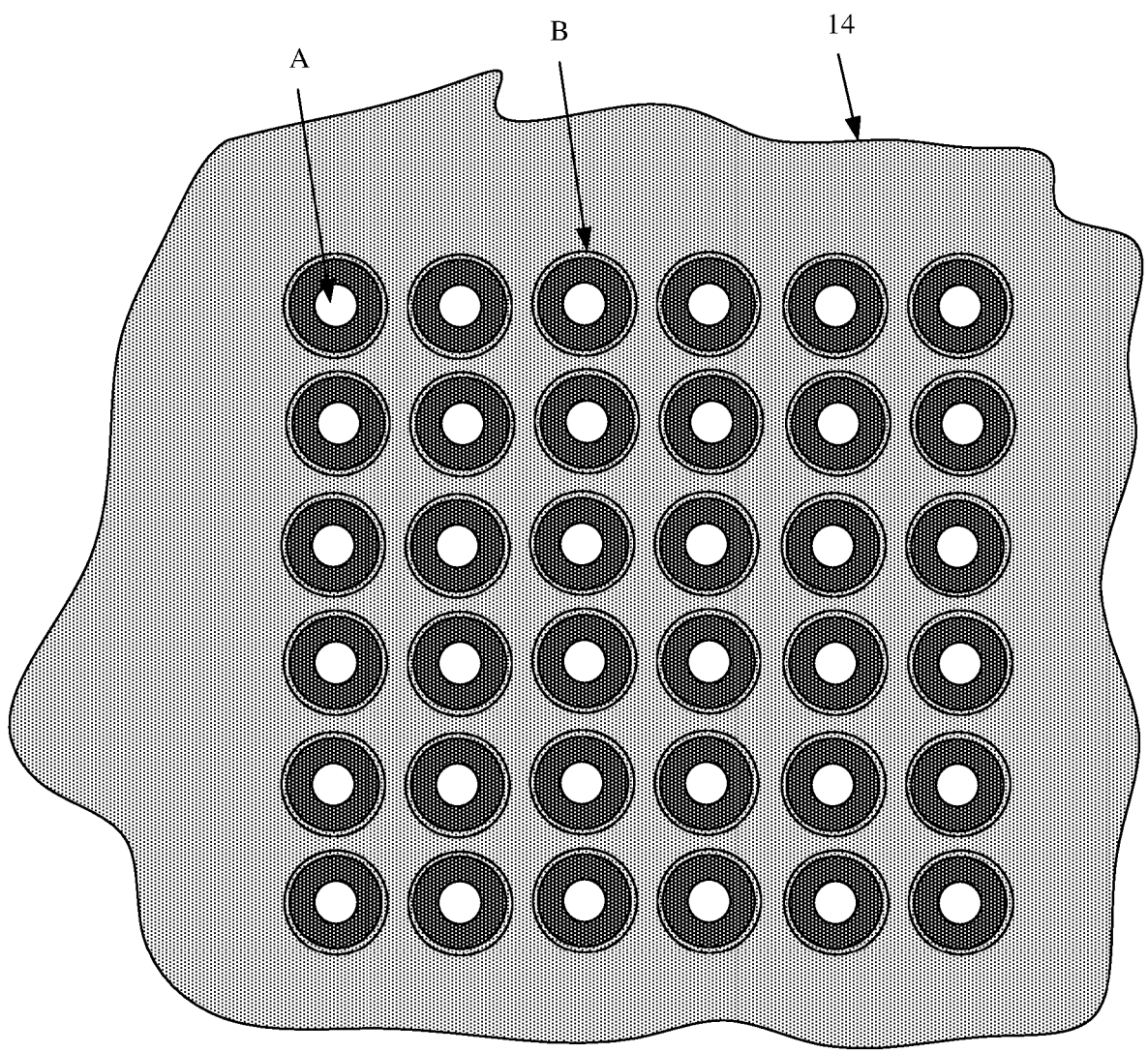
FIG. 6 is another schematic structural diagram of a printed circuit board according to an embodiment of the present invention.
Figure 7:
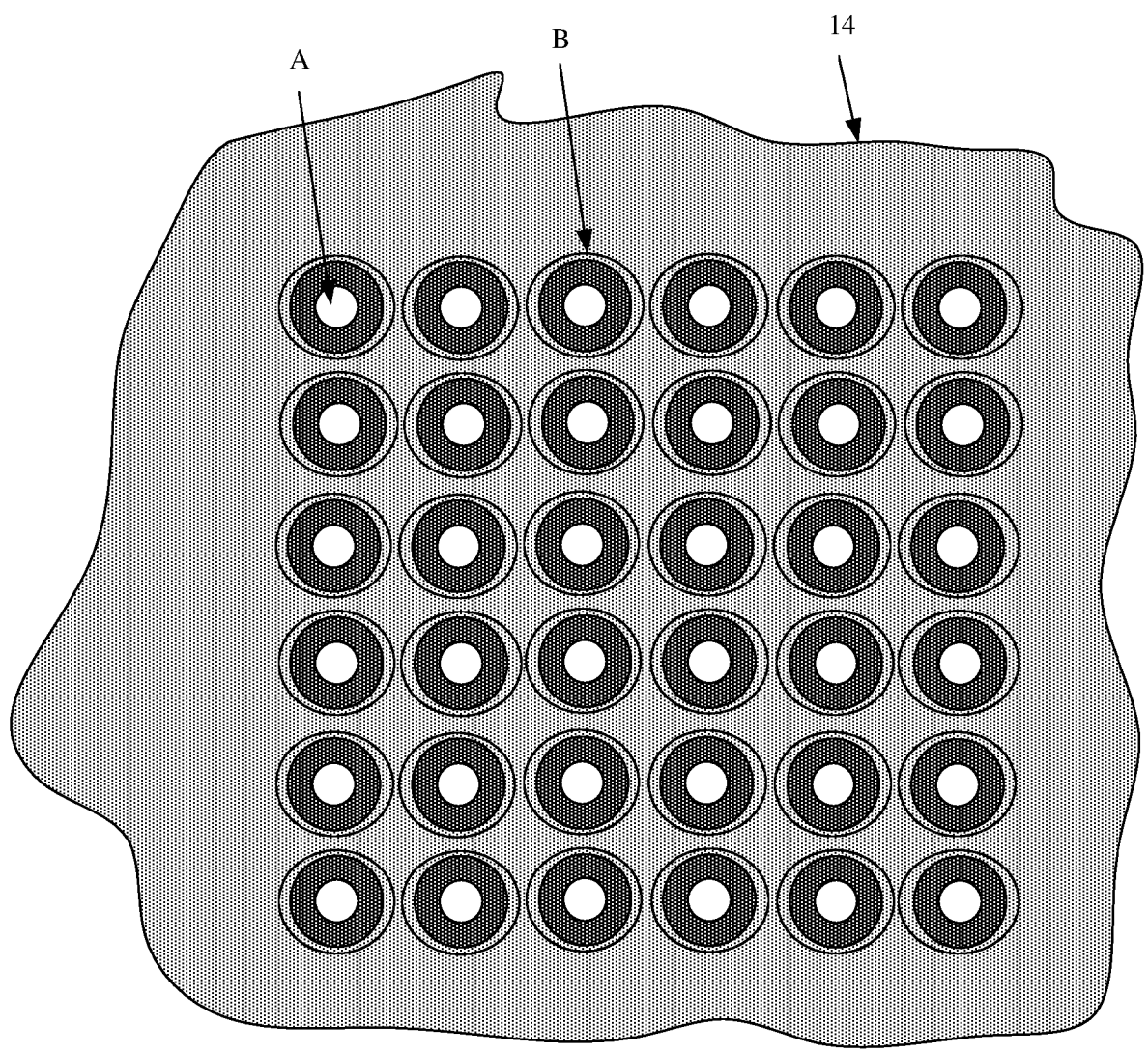
FIG. 7 is another schematic structural diagram of a printed circuit board according to an embodiment of the present invention.
Figure 8:
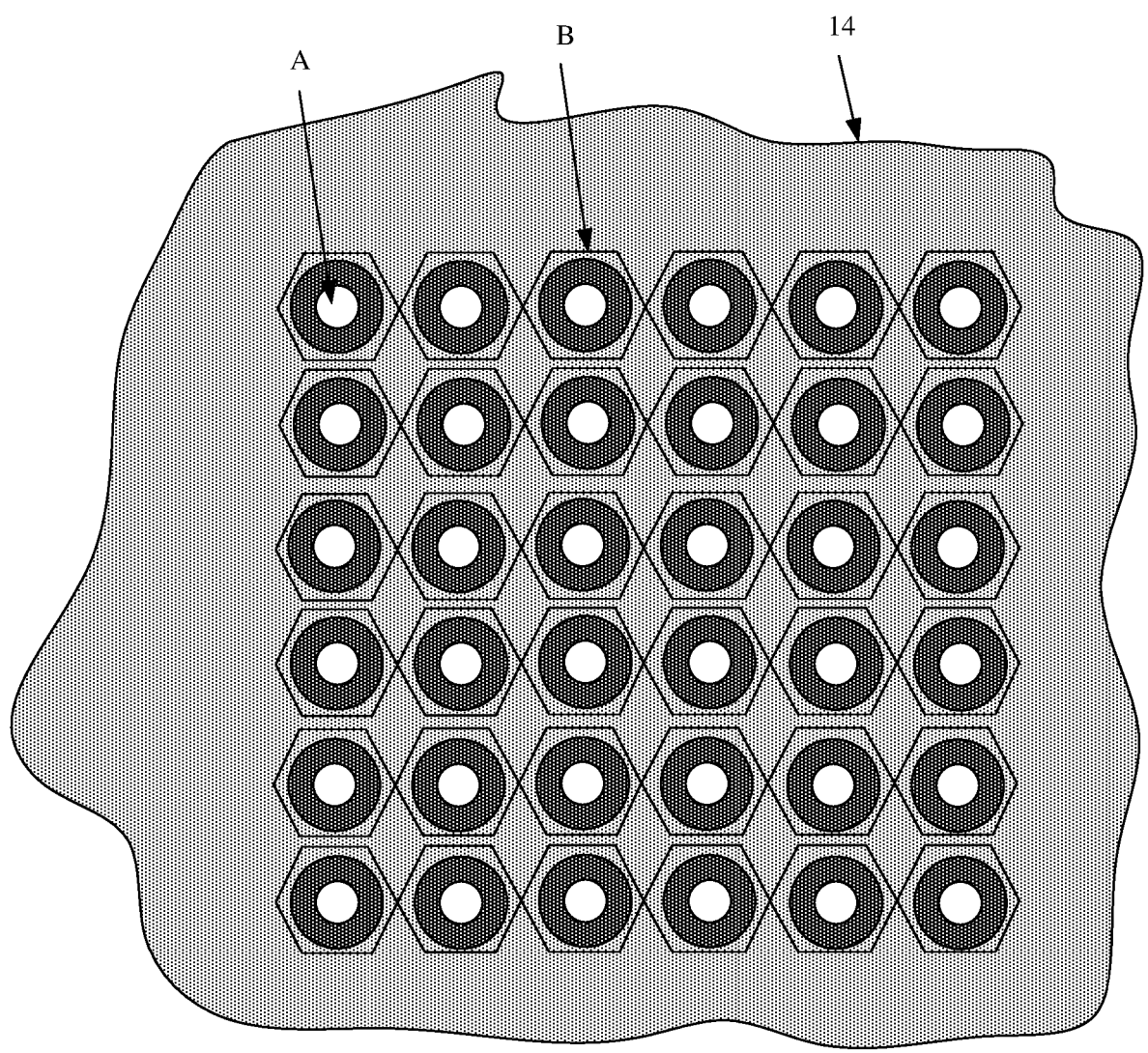
FIG. 8 is another schematic structural diagram of a printed circuit board according to an embodiment of the present invention.
Figure 9:
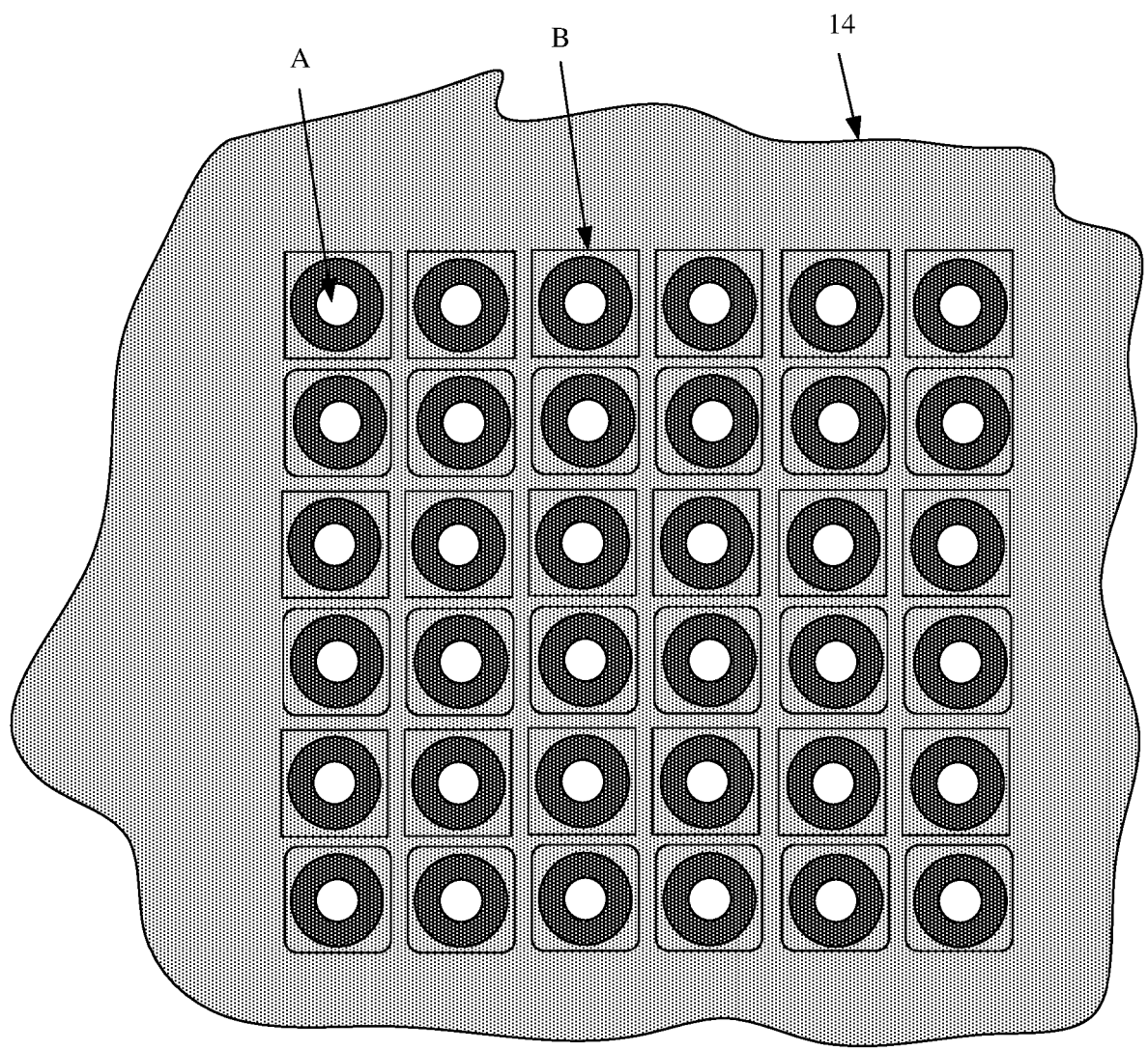
FIG. 9 is another schematic structural diagram of a printed circuit board according to an embodiment of the present invention.

According to a second aspect, the blocking structures each are in an annular structure. In FIG. 6, for example, the blocking structures B are in disk annular structures. Optionally, the blocking structures B may also be in other annular structures, for example, in ellipse structures (as shown in FIG. 7), or in multilateral annular structures (hexagonal annular structures as shown in FIG. 8, or quadrilateral annular structures as shown in FIG. 9). The annular-structured blocking structures can prevent the corrosion product from being spread to various directions of the target holes.

Optionally, the foregoing multilateral annular structures may further have rounded corners, or may not have rounded corners. Alternatively, some of the multilateral annular structures may have rounded corners, but some others may not have rounded corners. In FIG. 8, an example in which the hexagonal annular structures do not have rounded corners is used. In FIG. 9, an example in which some quadrilateral annular structures have rounded corners, and some quadrilateral annular structures do not have rounded corners is used. In addition, when the blocking structures B are in the annular structures, each of the blocking structures B in the printed circuit board corresponds to one target hole A, and each of the blocking structures B surrounds the corresponding target hole A (as shown in FIG. 6, FIG. 7, FIG. 8, or FIG. 9).

Figure 10:
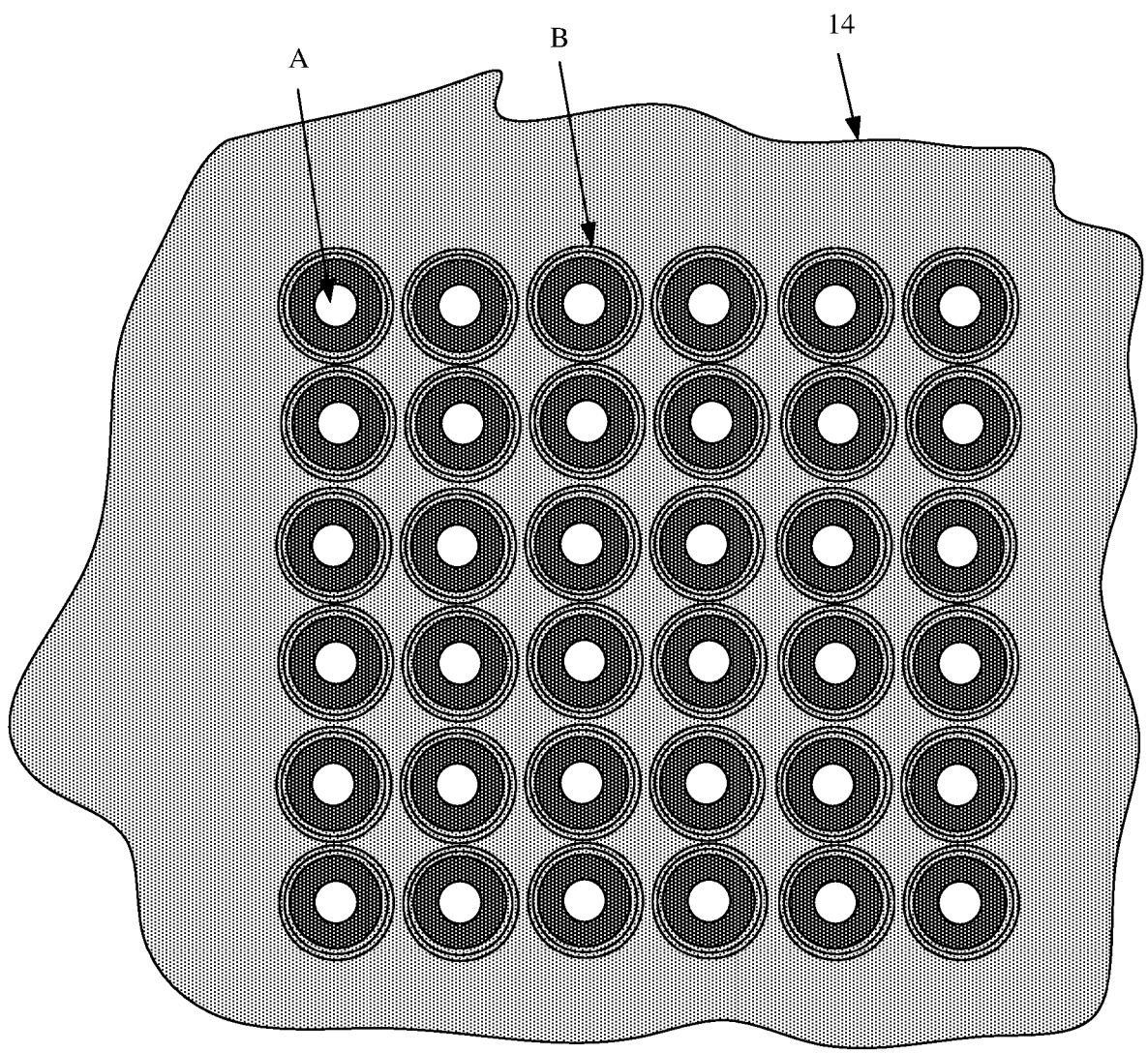
FIG. 10 is another schematic structural diagram of a printed circuit board according to an embodiment of the present invention.

According to a third aspect, based on a second form of the blocking structures B, each of the target holes A in the printed circuit board may correspond to the plurality of blocking structures B that are mutually embedded. In this way, the plurality of blocking structures can block the spreading of the corrosion product formed at the target holes A, thereby further improving an effect of blocking the spreading of the corrosion product. For example, based on FIG. 6, each of the target holes A may further correspond to the plurality of (two shown in FIG. 10) blocking structures B that are mutually embedded and that are in the disk annular structures. Based on FIG. 7, each of the target holes A may further correspond to the plurality of blocking structures B that are mutually embedded and that are in elliptical annular structures. Based on FIG. 8, each of the target holes A may further correspond to the plurality of blocking structures B that are mutually embedded and that are in the hexagonal annular structures. Based on FIG. 9, each of the target holes A may further correspond to the plurality of blocking structures B that are mutually embedded and that are in the quadrilateral annular structures.

Figure 11:
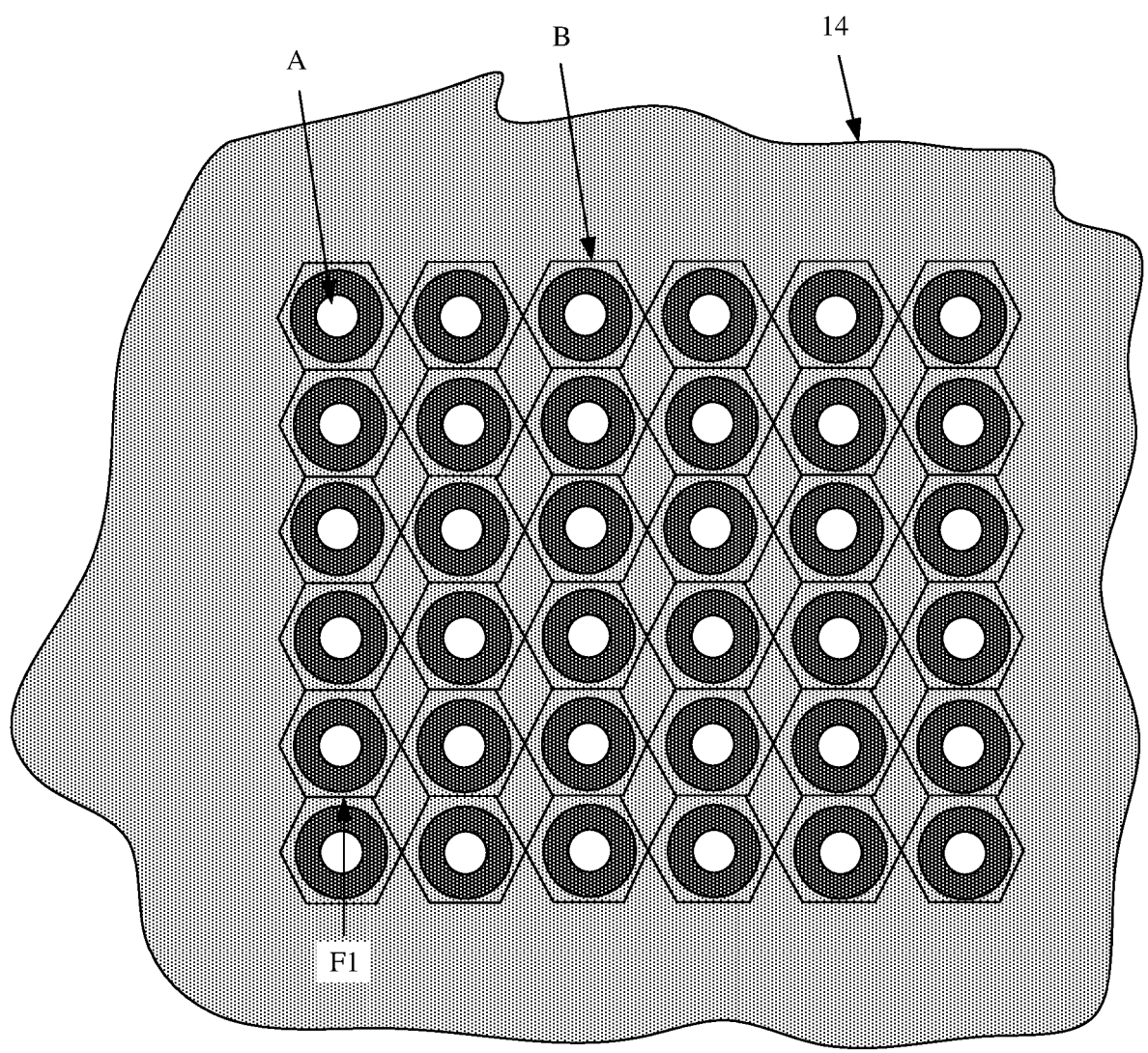
FIG. 11 is another schematic structural diagram of a printed circuit board according to an embodiment of the present invention.
Figure 12:
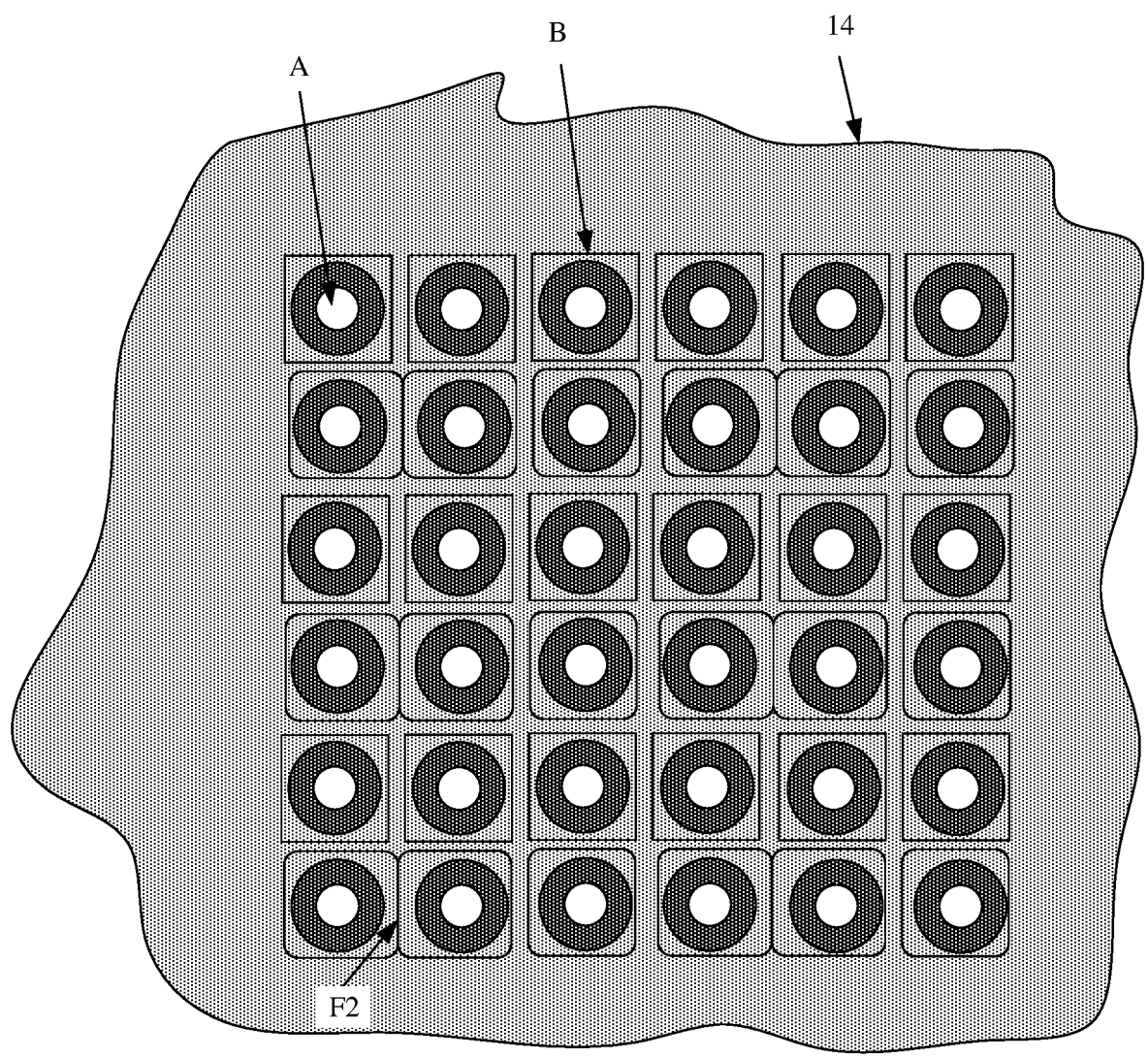
FIG. 12 is another schematic structural diagram of a printed circuit board according to an embodiment of the present invention.

According to a fourth aspect, as shown in FIG. 11 and FIG. 12, the blocking structures B each are in the annular structure. The plurality of target holes A in the printed circuit board are arranged in m rows and n columns, where m≥2 and n≥2. In both FIG. 11 and FIG. 12, an example in which m=n=6 is used. In this case, the blocking structures B each are in the multilateral annular structure and include a plurality of lateral structures. The plurality of lateral structures are sequentially arranged to form the multilateral annular structure, and each of the lateral structures corresponds to one lateral of the multilateral annular structure. For example, the hexagonal annual structure shown in FIG. 11 includes six lateral structures. The quadrilateral annular structure shown in FIG. 12 includes four lateral structures.

In a fourth form of the blocking structures, a plurality of blocking structures B that share the lateral structures exist in at least one of the row arrangement direction and the column arrangement direction of the target holes A. In other words, the shared lateral structure is a lateral structure of the plurality of blocking structures B. Structures of the blocking structures in the printed circuit board can be simplified by sharing the lateral structures between the blocking structures, thereby simplifying a process and reducing costs of manufacturing the blocking structures.

For example, in FIG. 11, in each of the blocking structures that is in the hexagonal annular structure, two target lateral structures $F_1$ whose length directions are parallel to the row arrangement direction of the target holes exist in the six lateral structures. Blocking structures corresponding to every two adjacent target holes in each column of the target holes share a same target lateral structure.

For another example, in FIG. 12, in each of the blocking structures that is in the quadrilateral annular structure, two target lateral structures $F_2$ whose length directions are parallel to the row arrangement direction of the target holes exist in the four lateral structures of the blocking structure. Blocking structures corresponding to every two adjacent target holes in each row of the target holes share a same target lateral structure $F_2$.

Figure 13:
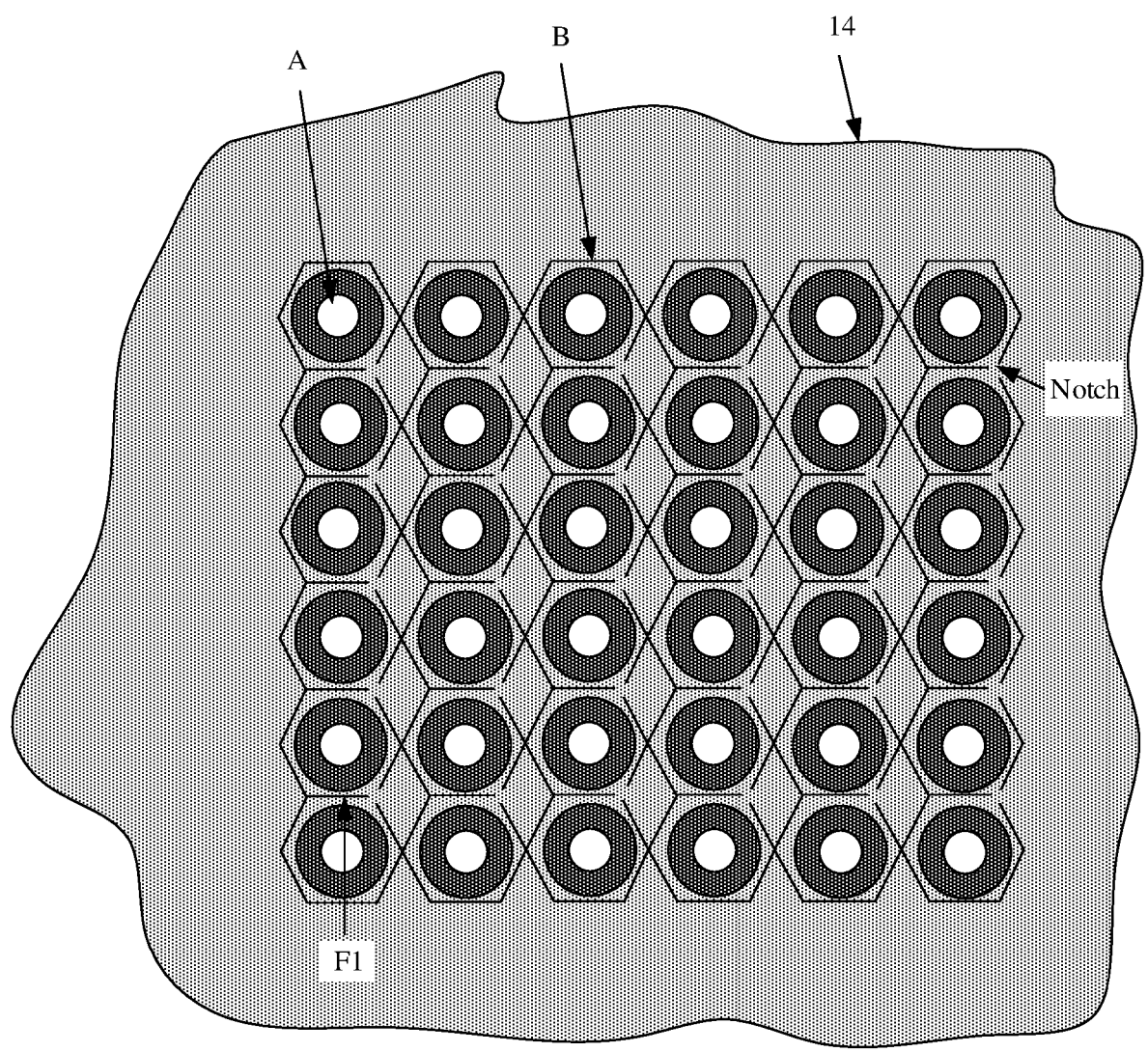
FIG. 13 is another schematic structural diagram of a printed circuit board according to an embodiment of the present invention.
Figures 14, 15:
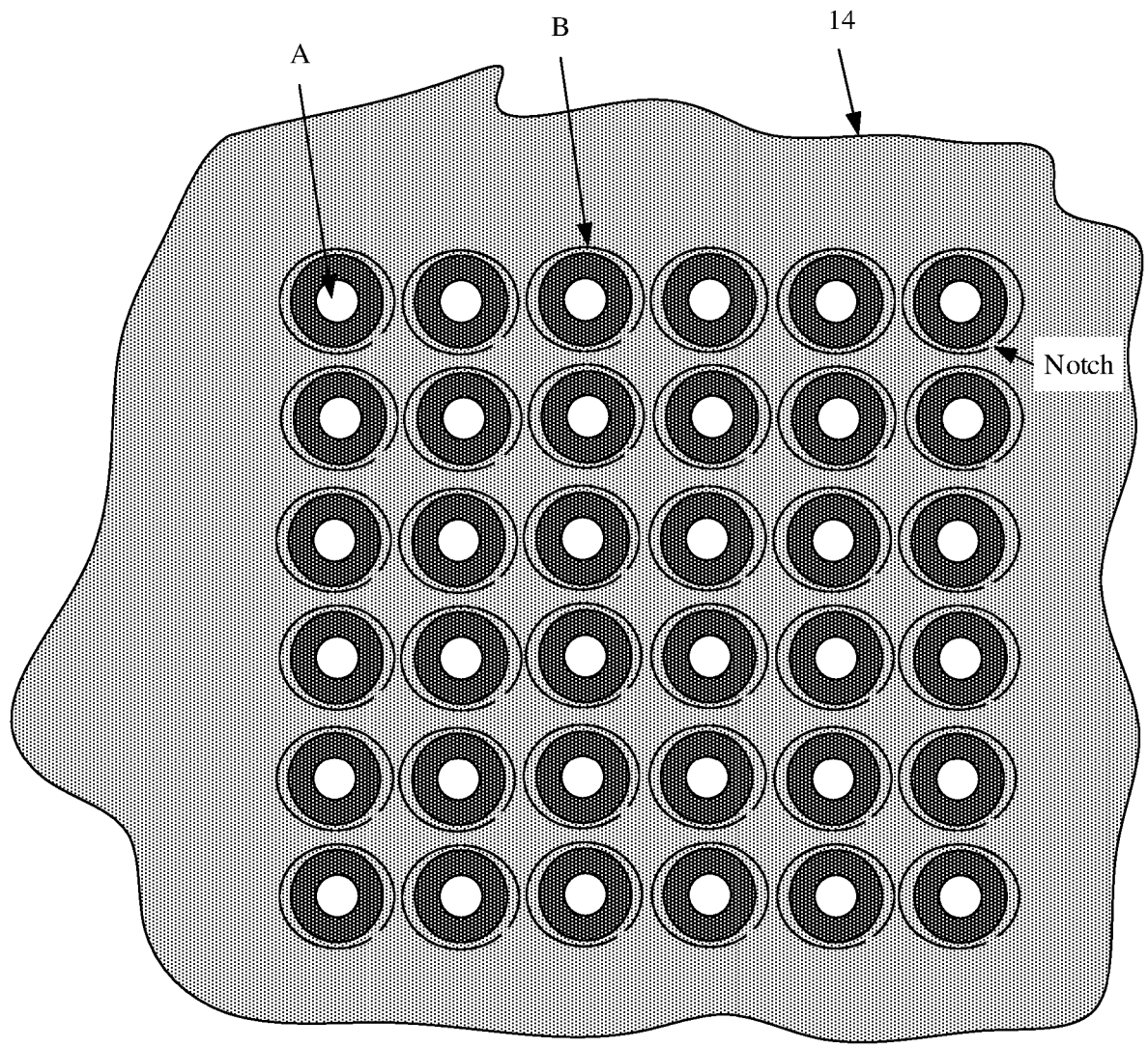
FIG. 14 is another schematic structural diagram of a printed circuit board according to an embodiment of the present invention.
FIG. 15 is a flowchart of a printed circuit board manufacturing method according to an embodiment of the present invention.

According to a fifth aspect, based on the second aspect, the third aspect, or the fourth aspect, the blocking structures each may be in an annular structure with at least one notch. The structures of the blocking structures can also be simplified by designing the blocking structures as the annular structures with the notches, thereby simplifying the process and the reducing costs of manufacturing the blocking structures. For example, based on FIG. 11, the blocking structures each may be a hexagonal annular structure (as shown in FIG. 13) with one notch. Based on FIG. 7, the blocking structures each may be an ellipse (as shown in FIG. 14) with two notches. Based on FIG. 8, the blocking structures each may be a hexagonal annular structure with two notches. Based on FIG. 9, the blocking structures each may be a quadrilateral annular structure with two notches.

Optionally, a center line of each of the target holes A is perpendicular to the printed circuit board. In a reference plane (not shown in the accompanying drawings of the specification) parallel to the printed circuit board, a connection line corresponding to any two adjacent target holes A are located outside an orthographic projection area of a notch on the reference plane. Two end points of the connection line are two points of orthographic projections of center lines of the any two adjacent target holes A on the reference plane. In this way, opening positions of the notches can be relatively far away from the two target holes, so that the corrosion product can be prevented from flowing through the notches.

It should be noted that FIG. 4 to FIG. 14 show only blocking structures on a same side of the printed circuit board. Optionally, blocking structures on the other side of the printed circuit board may also be the same as the blocking structures shown in any one of FIG. 4 to FIG. 14. This is not limited in this embodiment of the present invention. Alternatively, FIG. 4 to FIG. 14 show structures obtained through projection of blocking structures on the other side of the printed circuit board onto one side of the printed circuit board (in this case, in any one of the blocking structures shown in FIG. 4 to FIG. 14, some blocking structures are blocking structures on one side of the printed circuit board, and the some other blocking structures are blocking structures on the other side of the printed circuit board). This is not limited in the embodiment of the present invention.

In conclusion, in the printed circuit board provided by the embodiment of the present invention, the at least one side connected to the target holes in the printed circuit board has the blocking structures for blocking liquid flow. The blocking structures can prevent the liquid from flowing, thereby reducing the spreading of the corrosion product formed by the corrosion in the layer of water. In this way, the spreading area of the corrosion product outside the target holes can be relatively small, thereby reducing the probability that the printed circuit board cannot be normally used.

FIG. 15 is a flowchart of a printed circuit board manufacturing method according to an embodiment of the present invention. The method may be used to manufacture the printed circuit board shown in any one of FIG. 1B to FIG. 14. As shown in FIG. 15, the method may include:

Step 1501: Manufacture a printed circuit board, where the printed circuit board has target holes that penetrates through the printed circuit board, and an area that is not provided with the target holes has blocking structures for blocking liquid flow, where the area is on at least one side that is of the printed circuit board and that is connected to the target holes.

In conclusion, in the printed circuit board manufactured in the method provided in the embodiment of the present invention, the at least one side connected to the target holes in the printed circuit board has the blocking structures for blocking liquid flow. The blocking structures can prevent liquid from flowing, thereby reducing spreading of a corrosion product formed by corrosion in a layer of water. In this way, a spreading area of the corrosion product outside the target holes can be relatively small, thereby reducing a probability that the printed circuit board cannot be normally used.

Optionally, the blocking structures in the printed circuit board each include at least one of a groove and a protrusion, and there is a spacing between the groove and a conductive pattern layer. Optionally, an orthographic projection area of the groove on a base material in the printed circuit board is located outside an orthographic projection area of the conductive pattern layer on the base material. In this case, the blocking structures has a plurality of implementations, and for each of the different implementations of the blocking structures, blocking structure manufacturing methods are different.

Figure 16:
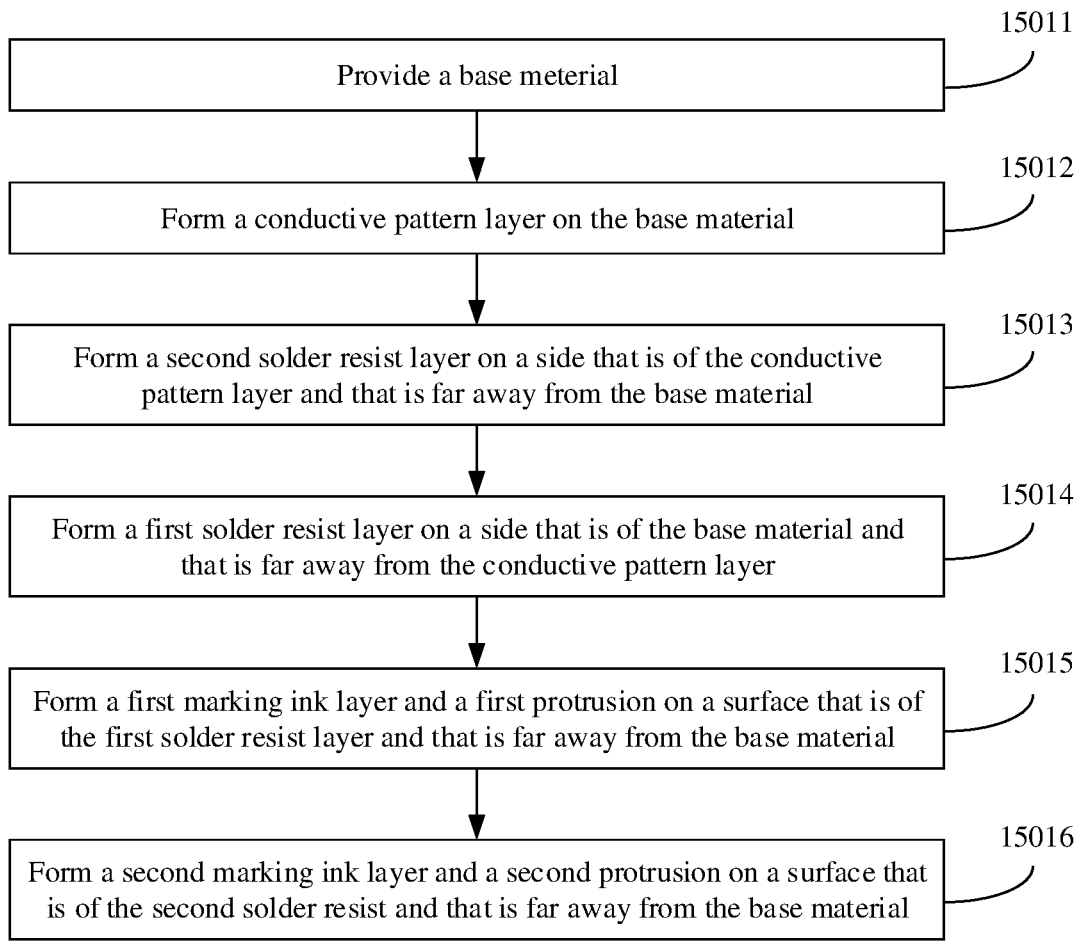
FIG. 16 is another schematic diagram of a printed circuit board manufacturing method according to an embodiment of the present invention.

Optionally, as shown in FIG. 16, step 1501 may include:

Step 15011: Provide the base material.

Figure 17:
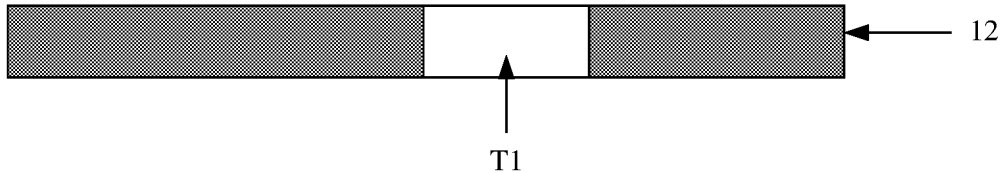
FIG. 17 is a schematic diagram of a process of manufacturing a printed circuit board according to an embodiment of the present invention.

As shown in FIG. 17, the base material 12 has a first through hole $T_1$ that penetrates through the base material. When the base material is provided, a base material layer that does not have a first through hole may be first provided, and then the first through hole $T_1$ is formed on the base material layer (for example, the first through hole $T_1$ is formed through mechanical digging, patterning processing, or the like), to obtain the base material 12.

Step 15012: Form the conductive pattern layer on the base material.

Figure 18:
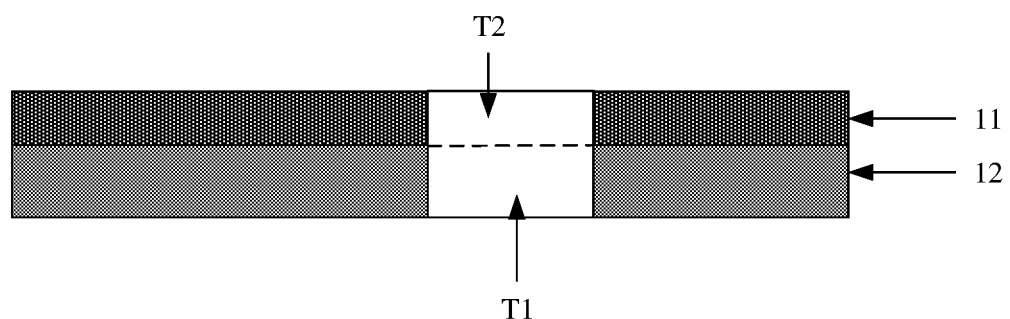
FIG. 18 is a schematic diagram of a process of manufacturing a printed circuit board according to an embodiment of the present invention.

After the base material is obtained, the base material may be first cleaned to remove impurities from a surface of the base material. Then, as shown in FIG. 18, the conductive pattern layer 11 may be formed on the base material 12. The conductive pattern layer 11 has a second through hole $T_2$ that penetrates through the conductive pattern layer, and the second through hole $T_2$ is connected to the first through hole $T_1$.

For example, a process of forming the conductive material layer may include: forming the conductive pattern layer on the base material through printing or spraying. Alternatively, a conductive material layer is first formed on the base material by using methods such as painting, physical vapor deposition (PVD for short), or chemical vapor deposition (CVD for short). Then, the conductive material layer is processed by using a pattern forming technology, to obtain the conductive pattern layer.

The PVD includes physical deposition methods such as magnetron sputtering or thermal evaporation. The CVD includes chemical deposition methods such as plasma enhanced chemical vapor deposition (PECVD for short). The pattern forming technology includes photoresist painting, exposure, development, etching, and photoresist lift off. That the conductive material layer is processed by using the pattern forming technology includes: painting a layer of photoresist on the conductive material layer; exposing the photoresist by using a mask to form an exposed area and a non-exposed area; removing photoresist in one of the exposed area and the non-exposed area by using a development technology and retaining photoresist in the other area; etching the area that is on the conductive material layer and that is not covered with the photoresist; and removing the photoresist on the conductive material layer after etching is completed, to obtain the conductive pattern layer 11. It should be noted that the photoresist may be positive photoresist or negative photoresist. If the photoresist is the positive photoresist, after the development technology is performed, photoresist in the exposed area is removed, and photoresist in the non-exposed area is retained. If the photoresist is the negative photoresist, after the development technology is performed, photoresist in the non-exposed area is removed, and photoresist in the exposed area is retained.

Step 15013: Form a second solder resist layer on a side that is of the conductive pattern layer and that is far away from the base material.

Figure 19:
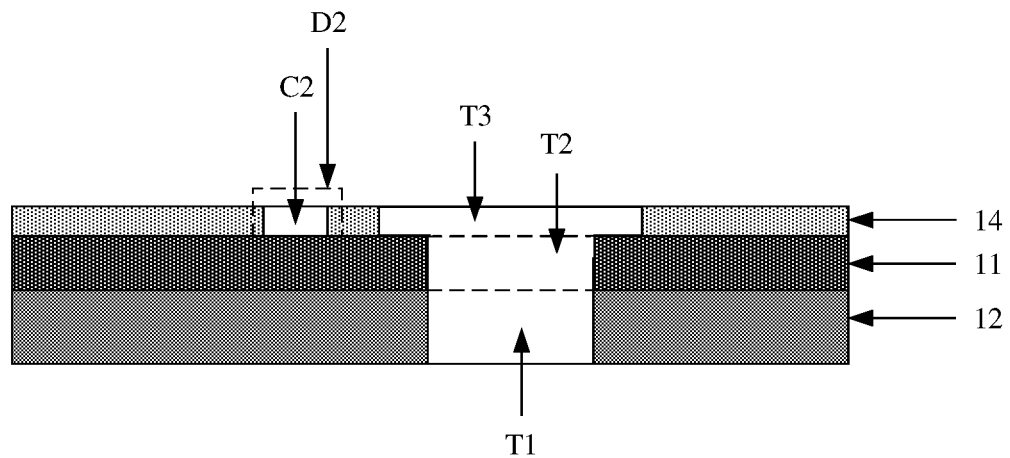
FIG. 19 is a schematic diagram of a process of manufacturing a printed circuit board according to an embodiment of the present invention.

After the conductive pattern layer is obtained, as shown in FIG. 19, the second solder resist layer 14 may be formed on the side that is of the conductive pattern layer 11 and that is far away from the base material 12. The second solder resist layer 14 has a third through hole $T_3$ that penetrates through the second solder resist layer 14, and the third through hole $T_3$ is connected to the second through hole $T_2$. In addition, for a process of forming the second solder resist layer 14, refer to the process of forming the conductive pattern layer 11 in step 15012. Details are not described herein in this embodiment of the present invention.

When the groove in the printed circuit board includes a second groove on a side on which the second solder resist layer is located (in FIG. 19, an example in which the side on which the second solder resist layer is located has groove is used), the second solder resist layer 14 has a second auxiliary hole C2 that penetrates through the second solder resist layer 14, and the second auxiliary hole C2 and a surface of the base material 12 facing the second solder resist layer 14 form a second groove D2 on the side on which the second solder resist layer 14 is located.

Step 15014: Form a first solder resist layer on a side that is of the base material and that is far away from the conductive pattern layer.

Figure 20:
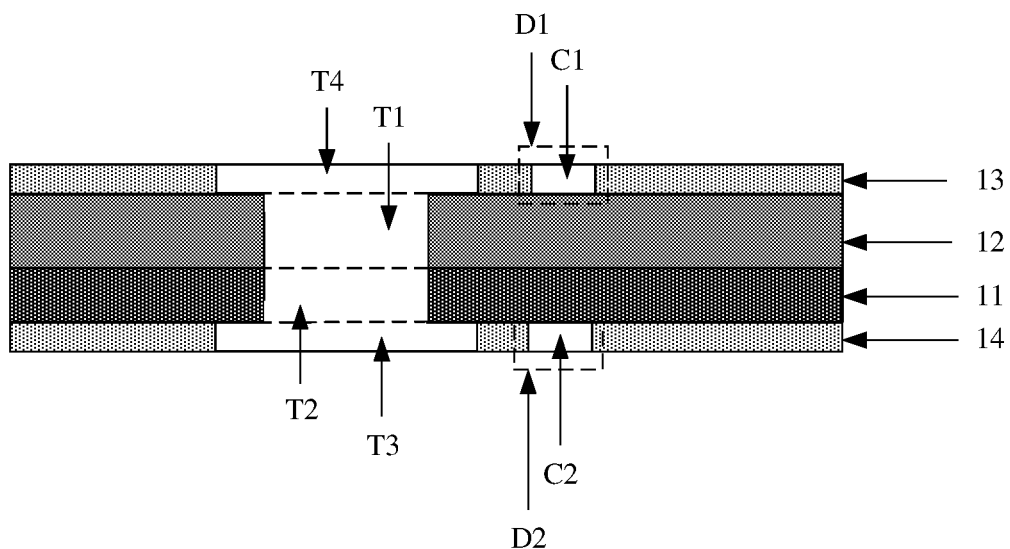
FIG. 20 is a schematic diagram of a process of manufacturing a printed circuit board according to an embodiment of the present invention.

After a second marking ink layer is formed, as shown in FIG. 20, the base material on which the second marking ink layer is formed may be reversed, and the first solder resist layer 13 is formed on the side that is of the base material 12 and that is far away from the conductive pattern layer. The first solder resist layer 13 has a fourth through hole $T_4$ that penetrates through the first solder resist layer 13, and the fourth through hole $T_4$ is connected to the first through hole $T_1$.

Because the first through hole $T_1$ is connected to both the second through hole $T_2$ and the fourth through hole $T_4$, and the second through hole $T_2$ is connected to the third through hole $T_3$, all the first through hole $T_1$, the second through hole $T_2$, the third through hole $T_3$, and the fourth through hole $T_4$ are connected and can from target holes that penetrate through the first solder resist layer 13, the base material 12, the conductive pattern layer 11, and the second solder resist layer 14.

It should be noted that, for a process of forming the first solder resist layer 13, refer to the process of forming the conductive pattern layer 11 in step 15012. Details are not described herein in this embodiment of the present invention.

In addition, when a side on which the first solder resist layer is located in the printed circuit board has the groove (in FIG. 20, an example in which the side on which the first solder resist layer is located has the groove is used), the first solder resist layer 13 has a first auxiliary hole C1 that penetrates through the first solder resist layer 13, and the first auxiliary hole C1 and a surface of the base material 12 facing the first solder resist layer 13 form a first groove D1 on the side on which the first solder resist layer 13 is located.

Step 15015: Form a first marking layer and a first protrusion on the surface that is of the first solder resist layer and that is far away from the base material.

Figure 21:
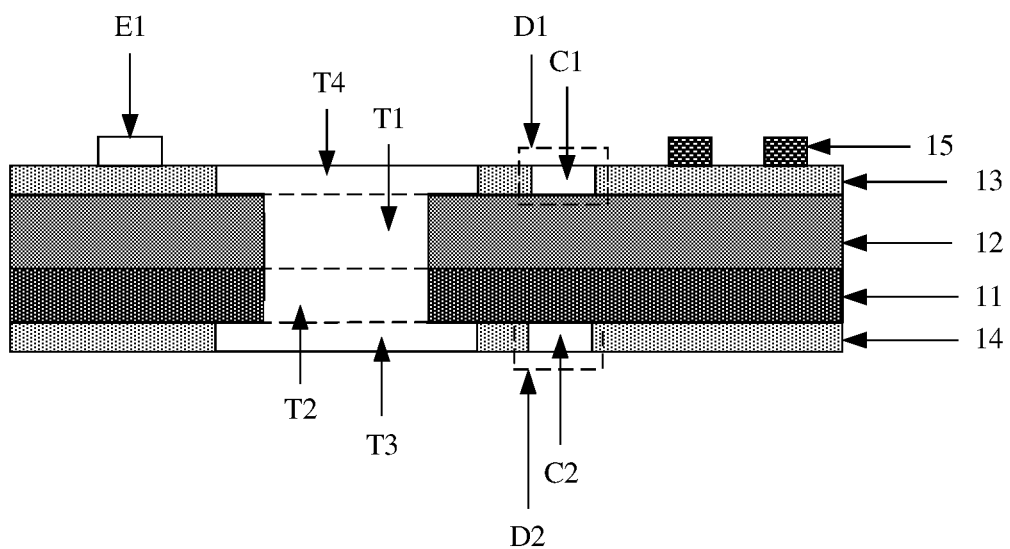
FIG. 21 is a schematic diagram of a process of manufacturing a printed circuit board according to an embodiment of the present invention.

After the first solder resist layer is formed, as shown in FIG. 21, the first marking ink layer 15 and the first protrusion E1 may be formed on the surface that is of the first solder resist layer 13 and that is far away from the base material 12. There are spacings between the first marking ink layer 15 and the target holes, and there are spacings between the first protrusion E1 and the target holes. There are spacings between the first marking ink layer 15 and the blocking structures, and there are spacings between the first protrusion E1 and the blocking structures.

Optionally, a material of the first marking ink layer 15 is the same as a material of the first protrusion E1. Therefore, the first marking ink layer 15 and the first protrusion E1 may be formed at the same time. Optionally, the first marking ink layer 15 and the first protrusion E1 may be separately formed, and the material of the first marking ink layer 15 and the material of the first protrusion E1 may also be different. This is not limited in this embodiment of the present invention.

For example, when the first marking ink layer 15 and the first protrusion E1 are formed at the same time, a process of forming the first marking ink layer 15 and the first protrusion E1 may include: forming, through printing or spraying, the first marking ink layer 15 and the first protrusion E1 on the surface that is of the first solder resist layer 13 and that is far away from the base material 12. Alternatively, a marking material layer (for example, a marking ink layer) is first formed by using the methods such as the painting, the PVD, or the CVD. Then, the marking material layer is processed by using the pattern forming technology, to obtain the first marking ink layer 15 and the first protrusion E1.

Step 15016: Form the second marking ink layer and a second protrusion on a surface that is of the second solder resist layer and that is far away from the base material.

After the second solder resist layer is formed, as shown in FIG. 3, the second marking ink layer 16 and the second protrusion E2 may be formed on the surface that is of the second solder resist layer 14 and that is far away from the base material 12. There are spacings between the second marking ink layer 16 and the target holes, and there are spacings between the second protrusion E2 and the target holes. There are spacings between the second marking ink layer 16 and the blocking structures, and there are spacings between the second protrusion E2 and the blocking structures.

Optionally, a material of the second marking ink layer 16 is the same as a material of the second protrusion E2. Therefore, the second marking ink layer 16 and the second protrusion E2 may be formed at the same time. Optionally, the second marking ink layer 16 and the second protrusion E2 may be separately formed, and the material of the second marking ink layer 16 and the material of the second protrusion E2 may also be different. This is not limited in this embodiment of the present invention. For a process of forming the second marking ink layer 16 and the second protrusion E2, refer to the process of forming the first marking ink layer 15 and the first protrusion E1 in step 15015. Details are not described herein in this embodiment of the present invention.

It should be noted that the blocking structures in the printed circuit board has a plurality of implementations, and for each of the different implementations of the blocking structures, printed circuit board manufacturing methods are different. FIG. 16 shows an example in which the printed circuit board shown in FIG. 3 is manufactured. In actual application, for any printed circuit board manufacturing method provided in the embodiments of the present invention, refer to FIG. 16. However, when the side on which the first solder resist layer is located does not have the first groove, the first solder resist layer formed in step 15014 does not have the first auxiliary hole. When the side on which the second solder resist layer is located does not have the second groove, the second solder resist layer formed in step 15013 does not have the second auxiliary hole. When the side on which the first solder resist layer is located does not have the first protrusion, the first protrusion does not need to be formed on the surface that is of the first solder resist and that is far away from the base material in step 15015. When the side on which the second solder resist layer is located does not have the second protrusion, the second protrusion does not need to be formed on the surface that is of the second solder resist layer and that is far away from the base material in step 15016.

In conclusion, in the printed circuit board manufactured in the method provided in the embodiments of the present invention, the at least one side connected to the target holes in the printed circuit board has the blocking structures for blocking liquid flow. The blocking structures can prevent the liquid from flowing, thereby reducing spreading of a corrosion product formed by corrosion in a layer of water. In this way, the spreading area of the corrosion product outside the target holes can be relatively small, thereby reducing the probability that the printed circuit board cannot be normally used.

It should be noted that the method embodiments provided in the embodiments of the present invention and the corresponding printed circuit board embodiments can be cross-referenced. This is not limited in the embodiments of the present invention. It should be noted that a sequence of the steps of the method embodiments provided in the embodiments of the present invention can be adjusted properly, and a step may also be added or removed based on situations. Any modified method that can be readily figured out by a person skilled in the art without departing from a technical scope disclosed in the present invention shall fall within the protection scope of the present invention, and therefore details are not described.

An embodiment of the present invention provides an electronic device. The electronic device includes any one of the foregoing printed circuit boards (for example, the printed circuit board shown in any one of FIG. 1B to FIG. 14).

Optionally, the electronic device may be an electronic device, for example, a server, a mobile phone, a computer, a radio television set, a game console, or an electronic watch, that includes a printed circuit board.

Optionally, the electronic device may also be a communication device.

The foregoing descriptions are merely optional embodiments of this application, but are not intended to limit this application. Any modification, equivalent replacement, or improvement made without departing from the spirit and principle of this application shall fall within the protection scope of this application.

What is claimed is:

1. A printed circuit board, wherein a plurality of target holes penetrate through the printed circuit board, and wherein the printed circuit board comprises a plurality of blocks disposed in a first area, the first area comprises at least one side of the printed circuit board and is adjacent to the plurality of target holes but does not include the plurality of target holes, wherein each block of the plurality of blocks is next to a target hole of the plurality of target holes, and wherein the plurality of blocks are configured to block liquid flow; and wherein:
- the printed circuit board comprises a first solder resist layer, a base material over the first solder resist layer, a conductive pattern layer over the base material, and a second solder resist layer over the conductive pattern layer;
- the target holes penetrate through the first solder resist layer, the base material, the conductive pattern layer, and the second solder resist layer; and
- the blocks of the plurality of blocks each comprise at least one of a groove or a protrusion;
- for each block of the plurality of blocks that comprises a groove, the respective groove is physically separate from the conductive pattern layer;
- when the first area comprises a side of the printed circuit board on which the first solder resist layer is located, and the plurality of blocks comprises a first groove, the first groove is defined by a first auxiliary hole that penetrates through the first solder resist layer to a surface of the base material; and
- when the first area comprises a side of the printed circuit board on which the second solder resist later is located, and the plurality of blocks comprises a second groove, the second groove is defined by a second auxiliary hole that penetrates through the second solder resist layer to a surface of the base material.

2. The printed circuit board according to claim 1, wherein an orthographic projection area of each groove on the base material is located outside an orthographic projection area of the conductive pattern layer on the base material.

3. The printed circuit board according to claim 1, wherein when the first area comprises a side of the printed circuit board on which the first solder resist layer is located, and the plurality of blocks comprises a first protrusion, the first protrusion is disposed on a surface of the first solder resist layer that faces away from the base material; and when the first area comprises a side of the printed circuit board on which the second solder resist layer is located, and the plurality of blocks comprises a second protrusion, the second protrusion is located on a surface of the second solder resist layer that faces away from the base material.

4. The printed circuit board according to claim 3, further comprising:
a first marking ink layer; and
a second marking ink layer;
wherein the first marking ink layer is located on the surface of the first solder resist layer that faces away from the base material, and the second marking ink layer is located on the surface of the second solder resist layer that faces away from the base material; and
a material of the first protrusion is the same as a material of the first marking ink layer and, and a material of the second protrusion is the same as a material of the second marking ink layer.

5. The printed circuit board according to claim 1, wherein for each block of the plurality of blocks that comprises a groove, a depth range of the respective groove is from 10 micrometers to 16 micrometers, and for each block of the plurality of blocks that comprises a protrusion, a height range of the respective protrusion is from 10 micrometers to 16 micrometers.

6. The printed circuit board according to claim 1, wherein a block of the plurality of blocks is disposed between every two target holes in the printed circuit board.

7. The printed circuit board according to claim 6, wherein the plurality of target holes in the printed circuit board are arranged in m rows and n columns, n≥2, n≥2, and the blocks are arranged in a strip structure; and at least one block of the plurality of blocks whose length direction is parallel to a row arrangement direction of the plurality of target holes is disposed between every two of the rows of the target holes, and at least one block of the plurality of blocks whose length direction is parallel to a column arrangement direction of the plurality of target holes is disposed between every two of the columns of the target holes.

8. The printed circuit board according to claim 6, wherein a structure of each block is an annular structure, each of the blocks corresponds to one target hole, and each of the blocks surrounds the corresponding one target hole.

9. The printed circuit board according to claim 8, wherein each of the target holes in the printed circuit board corresponds to a plurality of blocks that are mutually embedded.

10. The printed circuit board according to claim 8, wherein:
the plurality of target holes in the printed circuit board are arranged in m rows and n columns, m≥2, n≥2, and the blocks each are in a multilateral annular structure and comprise a plurality of lateral structures; and
at least two blocks that share the lateral structures are disposed in at least one of the row arrangement direction and a column arrangement direction of the plurality of target holes.

11. The printed circuit board according to claim 8, wherein a structure of each of the blocks of the plurality of blocks is an annular structure with at least one notch.

12. The printed circuit board according to claim 11, wherein:
a center line of each of the target holes is perpendicular to a surface of the printed circuit board; and
in a reference plane that is parallel to the printed circuit board, a connection line between any two adjacent target holes is located outside an orthographic projection area of a notch on the reference plane, and two end points of the connection line are two points of orthographic projections of center lines of the any two adjacent target holes on the reference plane.

13. The printed circuit board according to claim 1, wherein the target holes in the printed circuit board each comprise at least one of a press-fit hole, a test hole, or a via.

14. A method, comprising:
forming a printed circuit board, wherein a plurality of target holes penetrate through the printed circuit board, and wherein the printed circuit board comprises a plurality of blocks disposed in a first area, the first area comprises at least one side of the printed circuit board and is adjacent to the plurality of target holes but does not include the plurality of target holes, wherein each block of the plurality of blocks is next to a target hole of the plurality of target holes, and wherein the plurality of blocks are configured to block liquid flow; and
wherein forming the printed circuit board comprises:

forming a first solder resist layer, forming a base material over the first solder resist layer, forming a conductive pattern layer over the base material, and forming a second solder resist layer over the conductive pattern layer;

wherein the target holes penetrate through the first solder resist layer, the base material, the conductive pattern layer, and the second solder resist layer;

wherein the blocks of the plurality of blocks each comprise at least one of a groove or a protrusion;

wherein for each block of the plurality of blocks that comprises a groove, the respective groove is physically separate from the conductive pattern layer;

wherein when the first area comprises a side of the printed circuit board on which the first solder resist layer is located, and the plurality of blocks comprises a first groove, the first groove is defined by a first auxiliary hole that penetrates through the first solder resist layer to a surface of the base material; and wherein when the first area comprises a side of the printed circuit board on which the second solder resist layer is located, and the plurality of blocks comprises a second groove, the second groove is defined by a second auxiliary hole that penetrates through the second solder resist layer to a surface of the base material.

15. The method according to claim 14, wherein an orthographic projection area of each groove on the base material is located outside an orthographic projection area of the conductive pattern layer on the base material.

16. The method according to claim 14, wherein:

when the first area comprises a side of the printed circuit board on which the first solder resist layer is located, and the plurality of blocks comprises a first protrusion, the first protrusion is disposed on a surface of the first solder resist layer that faces away from the base material; and when the first area comprises a side of the printed circuit board on which the second solder resist layer is located, and the plurality of blocks comprises a second protrusion, the second protrusion is located on a surface of the second solder resist layer that faces away from the base material.

17. The method according to claim 16, wherein forming the printed circuit board further comprises:

forming a first marking ink layer on the surface of the first solder resist layer that faces away from the base material; and forming a second marking ink layer on the surface of the second solder resist layer that faces away from the base material, wherein a material of the first protrusion is the same as a material of the first marking ink layer and, and a material of the second protrusion is the same as a material of the second marking ink layer.

18. An electronic device, comprising:

a printed circuit board, wherein a plurality of target holes penetrate through the printed circuit board, and wherein the printed circuit board comprises a plurality of blocks disposed in a first area, the first area comprises at least one side of the printed circuit board and is adjacent to the plurality of target holes but does not include the plurality of target holes, wherein each block of the plurality of blocks is next to a target hole of the plurality of target holes, and wherein the plurality of blocks are configured to block liquid flow, and wherein:

the printed circuit board comprises a first solder resist layer, a base material over the first solder resist layer, a conductive pattern layer over the base material, and a second solder resist layer over the conductive pattern layer;

the target holes penetrate through the first solder resist layer, the base material, the conductive pattern layer, and the second solder resist layer; and the blocks of the plurality of blocks each comprise at least one of a groove or a protrusion;

for each block of the plurality of blocks that comprises a groove, the respective groove is physically separate from the conductive pattern layer;

when the first area comprises a side of the printed circuit board on which the first solder resist layer is located, and the plurality of blocks comprises a first groove, the first groove is defined by a first auxiliary hole that penetrates through the first solder resist layer to a surface of the base material; and when the first area comprises a side of the printed circuit board on which the second solder resist later is located, and the plurality of blocks comprises a second groove, the second groove is defined by a second auxiliary hole that penetrates through the second solder resist layer to a surface of the base material.

* * * * *

UNITED STATES PATENT AND TRADEMARK OFFICE
CERTIFICATE OF CORRECTION

PATENT NO. : 11,882,665 B2
APPLICATION NO. : 17/358768
DATED : January 23, 2024
INVENTOR(S) : Sun et al.

It is certified that error appears in the above-identified patent and that said Letters Patent is hereby corrected as shown below:

In the Claims

In Column 19, Claim 1, Line 30, delete "later" and insert -- layer --.

In Column 20, Claim 7, Line 12, delete "$n\geq2, n\geq2,$" and insert -- $m\geq2, n\geq2,$ --.

In Column 22, Claim 18, Line 41, delete "later" and insert -- layer --.

Signed and Sealed this
Ninth Day of April, 2024

Katherine Kelly Vidal
*Director of the United States Patent and Trademark Office*